United States Patent [19]

Kimura et al.

[11] Patent Number: 5,452,315
[45] Date of Patent: Sep. 19, 1995

[54] SEMICONDUCTOR LASER WITH SEMI-INSULATING CURRENT BLOCKING LAYERS

[75] Inventors: Tatsuya Kimura; Kisuke Matsumoto; Akira Takemoto, all of Itami, Japan

[73] Assignee: Mitsubishi Denki Kabushiki Kaisha, Tokyo, Japan

[21] Appl. No.: 257,118

[22] Filed: Jun. 8, 1994

[30] Foreign Application Priority Data

Jun. 30, 1993 [JP] Japan .................. 5-160632

[51] Int. Cl.⁶ .................. H01S 3/18
[52] U.S. Cl. .................. 372/46
[58] Field of Search .................. 372/45, 43, 46

[56] References Cited

U.S. PATENT DOCUMENTS

| | | | |
|---|---|---|---|
| 4,928,285 | 5/1990 | Kushibe et al. | 372/46 |
| 4,935,936 | 6/1990 | Nelson et al. | 372/46 |
| 5,228,048 | 7/1993 | Takemoto et al. | 372/46 |
| 5,390,205 | 2/1995 | Mori et al. | 372/46 |

FOREIGN PATENT DOCUMENTS

| | | |
|---|---|---|
| 2206192 | 8/1990 | Japan . |
| 3167886 | 7/1991 | Japan . |
| 453289 | 2/1992 | Japan . |
| 4179291 | 6/1992 | Japan . |
| 5013888 | 1/1993 | Japan . |
| 5129714 | 5/1993 | Japan . |
| 5343811 | 12/1993 | Japan . |

Primary Examiner—Rodney B. Bovernick
Assistant Examiner—Robert McNutt
Attorney, Agent, or Firm—Leydig, Voit & Mayer

[57] ABSTRACT

A semiconductor laser includes a semiconductor substrate of a first conductivity type having opposite front and rear surfaces, a double-heterojunction structure including a first conductivity type lower cladding layer, an undoped active layer, and an upper cladding layer of a second conductivity type, opposite the first conductivity type, successively disposed on the front surface of the semiconductor substrate wherein the double-heterojunction structure is a mesa having opposite sides, and a light and current confinement structure disposed on the opposite sides of the mesa for confining laser light and laser driving current within the mesa. The confinement structure includes a first conductivity type mesa embedding layer, a second conductivity type mesa embedding layer, and a semi-insulating InP layer which are successively disposed on the semiconductor substrate contacting the opposite sides of the mesa. In this structure, since the semi-insulating semiconductor layer is not in contact with the active layer, unfavorable diffusion of impurities contained in the semi-insulating layer into the active layer is prevented.

12 Claims, 22 Drawing Sheets

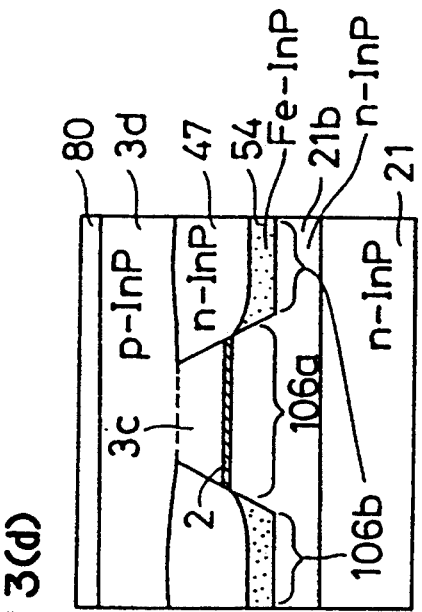
Fig. 13(a)
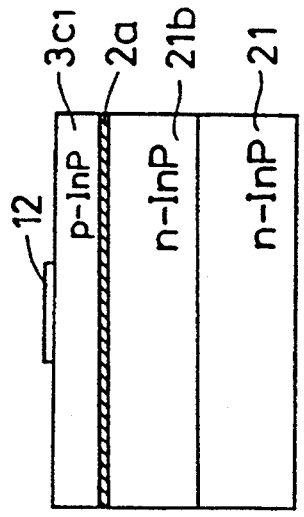
Fig. 13(b)
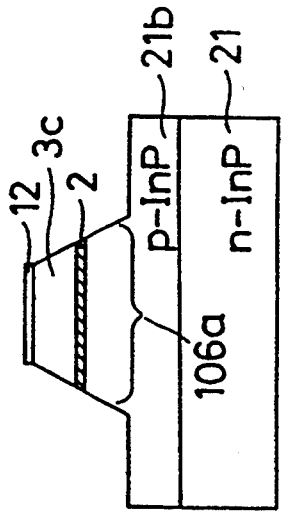
Fig. 13(c)
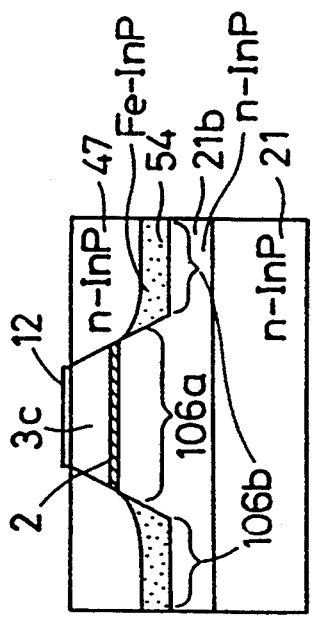
Fig. 13(d)
Fig. 13(e)

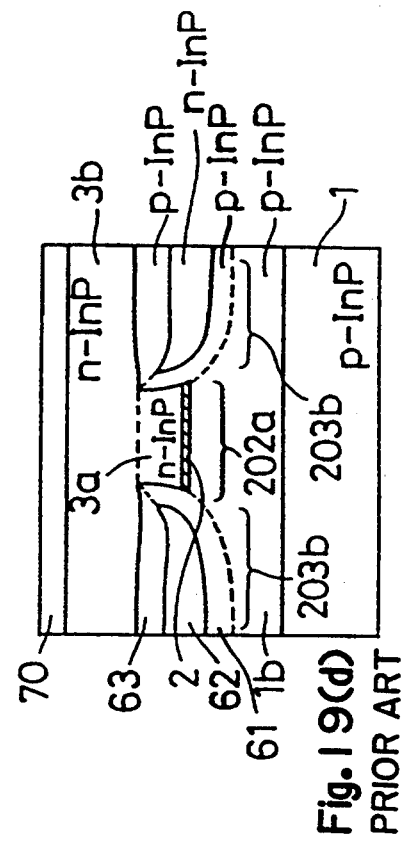
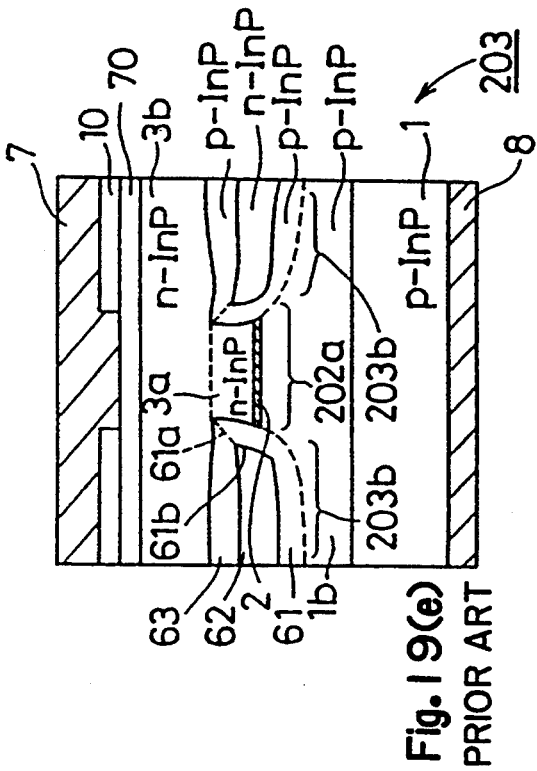
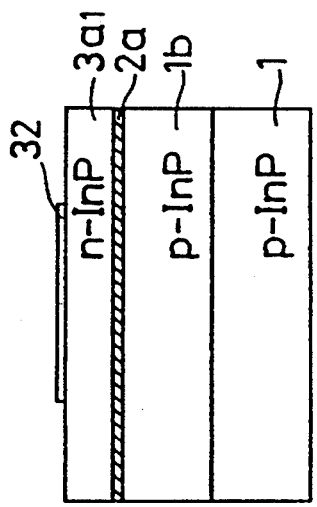
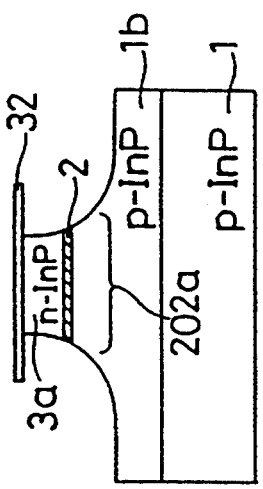
Fig. 19(a) PRIOR ART
Fig. 19(b) PRIOR ART
Fig. 19(c) PRIOR ART
Fig. 19(d) PRIOR ART
Fig. 19(e) PRIOR ART thermal equilibrium state forward biased state thermal equilibrium state forward biased state

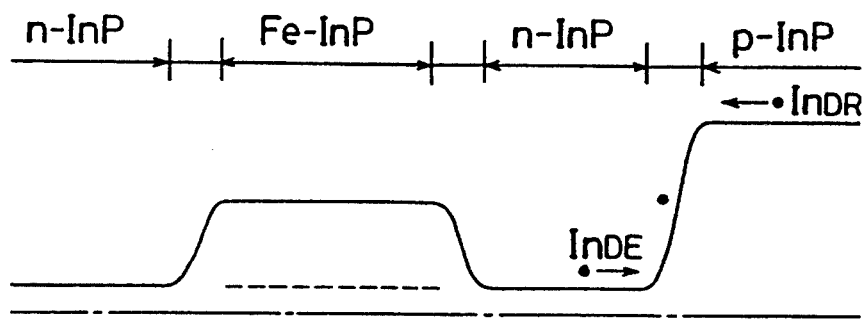
Fig.22(a)
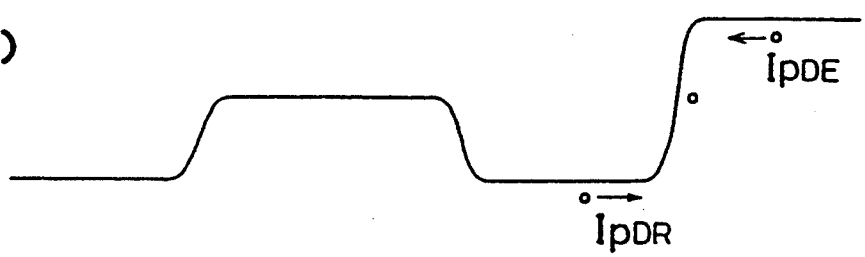
thermal equilibrium state
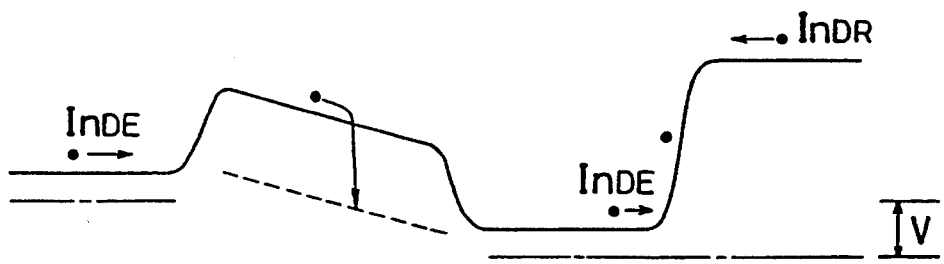
Fig.22(b)
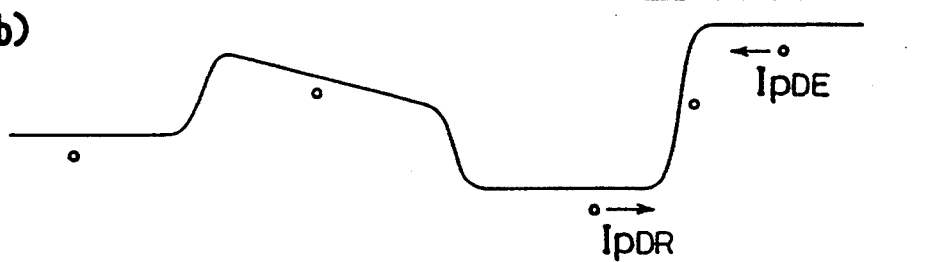
forward biased state

SEMICONDUCTOR LASER WITH SEMI-INSULATING CURRENT BLOCKING LAYERS

FIELD OF THE INVENTION

The present invention relates to semiconductor lasers and, more particularly, to a structure for reducing the contact resistance between a p side electrode and a p type semiconductor region, a structure of a current blocking layer for preventing impurities from diffusing into an active layer, and a structure of a current blocking layer for reducing reactive current flowing by an active layer. The invention also relates to methods for producing these structures.

BACKGROUND OF THE INVENTION

FIG. 14 is a sectional view illustrating a prior art buried heterostructure (BH) semiconductor laser. FIGS. 15(a)-15(e) are sectional views illustrating process steps in a method for fabricating the BH semiconductor laser of FIG. 14.

In the figures, a HB semiconductor laser 201 includes a stripe-shaped mesa structure 201a in which laser oscillation occurs and a light and current confinement structure 201b for confining laser light and laser driving current within the mesa structure 201a.

The mesa structure 201a comprises a mesa part 1a of an n type InP substrate 21a, an undoped active layer 2 disposed on the mesa part 1a, and a first p type InP cladding layer 3c disposed on the active layer 2. The light and current confinement structure 201b comprises an Fe doped semi-insulating InP layer 50 which is disposed on the n type InP substrate 21a contacting opposite sides of the mesa structure 201a and an n type InP layer 40 disposed on the semi-insulating InP layer 50.

A second p type InP cladding layer 3d is disposed on the mesa structure 201a as well as on the light and current confinement structure 201b. A p type InP contact layer 80 is disposed on the second p type InP cladding layer 3d. An insulating film 10 having a window 10a opposite the mesa structure 201a is disposed on the contact layer 80. A p side electrode 28 comprising AuZn alloy is disposed on the insulating film 10 contacting the p type InP contact layer 80 through the window 10a. An n side electrode 27 comprising CrAu alloy is disposed over the rear surface of the n type InP substrate 21a.

A description is given of the production process.

Initially, as illustrated in FIG. 15(a), an undoped InGaAsP layer 2a 0.1 $\mu$m thick and a p type InP layer $3c_1$ 0.5 $\mu$m thick are successively grown on the n type InP substrate 21a(first crystal growth). The carrier concentration of the p type InP layer $3c_1$ is about $1 \times 10^{18}$ cm$^{31}$ $^3$.

Then, an insulating film 31 of a prescribed pattern is formed on the p type InP layer $3c_1$ using conventional photolithographic techniques. Using the insulating film 31 as a mask, the p type InP layer $3c_1$, the undoped InGaAsP layer 2a, and the n type InP substrate 21a are selectively etched with a HBr system etchant to a depth of about 4.5 $\mu$m from the surface of the p type InP layer $3c_1$, forming the stripe-shaped mesa structure 201a (FIG. 15(b)).

In the step of FIG. 15(c), the Fe doped semi-insulating InP layer 50 is grown on the n type InP substrate 21a contacting opposite sides of the mesa structure 201a, and the n type InP layer 40 is grown on the Fe doped semi-insulating InP layer 50 until the surface of the InP layer 40 reaches the surface of the mesa structure 201a(second crystal growth), forming the light and current confinement structure 201b. The thickness of the semi-insulating InP mesa embedding layer 50 on the flat surface of the substrate 21a is about 3 $\mu$m, and the thickness of the n type InP layer 40 on the flat surface of the layer 50 is about 1.5 $\mu$m. The carrier concentrations of these layers 50 and 40 are about $4 \times 10^{16}$ cm$^{-3}$ and $7 \times 10^{18}$ cm$^{-3}$, respectively.

In the step of FIG. 15(d), after removal of the insulating film 31, the second p type InP cladding layer 3d having a thickness of about 1 $\mu$m and a carrier concentration of about $1 \times 10^{18}$ cm$^{-3}$ is formed on the first p type InP cladding layer 3c of the mesa 201a and on the n type InP layer 40 of the light and current confinement structure 201b. Then, the p type InP contact layer 80 having a thickness of about 0.5 $\mu$m and a carrier concentration of about $7 \times 10^{18}$ cm$^{-3}$ is formed on the cladding layer 3d.

Thereafter, the insulating film 10 having the window 10a opposite the mesa 201a is formed on the p type InP contact layer 80. Then, the p side electrode 28 is formed in contact with the p type InP contact layer 80 at the window 10a, and the n side electrode 27 is formed on the rear surface of the n type InP substrate 21a, completing the BH semiconductor laser 201 (FIG. 15(e)).

A description is given of the operation.

When a prescribed voltage is applied across the p side electrode 28 and the n side electrode 27, a potential difference is produced between the n type InP substrate 21a and the second p type InP cladding layer 3d, and current flows from the p type InP cladding layer 3d to the InP substrate 21a.

Since the semi-insulating InP layer 50 and the n type InP layer 40 are disposed on the opposite sides of the stripe-shaped mesa structure 201a, current is concentrated in the mesa structure 201a, and holes and electrons (charge carriers) are injected into the active layer 2 with high efficiency. When the quantity of the injected charge carriers reaches a certain level, laser oscillation occurs.

Since the semi-insulating InP mesa embedding layer 50 comprises Fe-doped InP having a deep level that captures electrons, portions of the structure at the opposite sides of the active layer 2 have high resistivity, whereby reactive current that does not contribute the laser oscillation is reduced.

FIG. 16 is a sectional view illustrating a prior art BH semiconductor laser employing a p type InP substrate. FIGS. 17(a)-17(e) are sectional views illustrating process steps in a method for fabricating the BH laser of FIG. 16.

In FIG. 16, a BH semiconductor laser 202 includes a p type InP substrate 1 having a surface in or near a (001) plane. A p type InP lower cladding layer 1b having a stripe-shaped mesa portion $1b_1$ is disposed on the surface of the p type InP substrate 1. A stripe-shaped mesa structure 202a comprises the mesa portion $1b_1$ of the lower cladding layer 1b, an undoped InGaAsP active layer 2 disposed on the mesa portion $1b_1$, and an n type InP upper cladding layer 3a disposed on the active layer 2. The stripe direction of the mesa 202a is parallel to a (110) direction.

An n type InP current blocking layer 41 is disposed on the p type InP lower cladding layer 1b contacting the opposite sides of the mesa structure 202b. A pn junction barrier produced between the p type InP cladding layer 1b and the n type InP current blocking layer 41 blocks holes. An Fe-doped InP layer 51 that traps electrons is disposed on the n type InP current blocking layer 41. The surface of the Fe-doped InP layer 51 is even with the surface of the mesa structure 202a.

The n type InP current blocking layer 41 and the Fe-doped InP layer 51 form light and current confinement structure 202b for confining laser light and laser driving current in the active layer 2 of the mesa structure 202a.

A second n type InP cladding layer 3b is disposed on the mesa structure 202a as well as on the light and current confinement structure 202b, and an n type InP contact layer 70 is disposed on the n type InP cladding layer 3b.

A description is given of the production process.

Initially, a p type InP lower cladding layer 1b 2 μm thick, an undoped InGaAsP layer 2a 0.1 μm thick, and an n type InP layer $3a_1$ about 0.5 μm thick are successively grown on the (001) or almost (001) surface of the p type InP substrate 1 by MOCVD (Metal Organic Chemical Vapor Deposition). Then, an $SiO_2$ film 1000 Å thick is deposited on the n type InP layer $3a_1$ by sputtering and patterned using conventional photolithographic techniques to form a stripe-shaped $SiO_2$ pattern 32 along the (110) direction (FIG. 17(a)). The carrier concentrations of the p type InP lower cladding layer 1b and the n type InP layer 3a are $1 \times 10^{18}$ cm$^{-3}$.

Using the $SiO_2$ pattern 32 as a mask, the n type InP layer $3a_1$, the InGaAsP layer 2a, and the p type InP lower cladding layer 1b are selectively etched with a HBr system etchant to a depth of 2.5 μm from the surface of the n type InP layer $3a_1$, forming the stripe-shaped mesa structure 202a (FIG. 17(b)).

Then, the n type InP current blocking layer 41 having a thickness of about 1 μm and a carrier concentration of about $7 \times 10^{18}$ cm$^{-3}$ is formed on the p type InP lower cladding layer 1b contacting the opposite sides of the mesa structure 202a, and the Fe-doped InP high resistivity layer 51 1.5 μm thick having a carrier concentration of $4 \times 10^{16}$ cm$^{-3}$ is formed on the current blocking layer 41 (FIG. 17(c)). These layers 41 and 51 are grown by MOCVD. In the MOCVD process, the n type InP current blocking layer 41 grows contacting the opposite side surfaces of the mesa structure 202a, and a surface in a (111)B plane appears at the upper end 41a of the current blocking layer 41 under the $SiO_2$ film 32 and a surface in a (221)B plane appears at the side surface 41b of the layer 41 along the side surface of the mesa.

After etching of the $SiO_2$ film 32 with HF, the second n type InP cladding layer 3b about 1 μm thick having a carrier concentration of $1 \times 10^{18}$ cm$^{-3}$ is grown on the first n type InP cladding layer 3a and on the InP high resistivity layer 51 and, successively, the n type InP contact layer 70 about 0.5 μm thick with a carrier concentration of $7 \times 10^{18}$ cm$^{-3}$ is grown on the cladding layer 3b by MOCVD (FIG. 17(d)).

Thereafter, the insulating film 10 having the window 10a opposite the mesa 202a is formed on the second n type InP cladding layer 3b. Finally, the n side electrode 7 is formed contacting the n type InP contact layer 70 through the window 10a, and the p side electrode 8 is formed on the rear surface of the p type InP substrate 1, completing the BH semiconductor laser 202 (FIG. 17(e)).

A description is given of the operation.

The operation of this HB laser 202 for laser oscillation is identical to that already described with respect to the HB laser 201 of FIG. 14. Hereinafter, the function of the light and current confinement structure 202a comprising the n type InP current blocking layer 41 and the Fe-doped InP high resistivity layer 51 will be described.

FIGS. 22(a) and 22(b) are energy band diagrams of the light and current confinement structure 202b, i.e., the laminated structure comprising the p type InP cladding layer 1b, the n type InP current blocking layer 41, the Fe-doped InP high resistivity layer 51, and the second n type InP cladding layer 3b, in which FIG. 22(a) illustrates the energy band in a thermal equilibrium state where no bias is applied and FIG. 22(b) illustrates the energy band in a state where a forward bias is applied (hereinafter referred to as forward biased state). FIGS. 21(a) and 21(b) are energy band diagrams of a light and current confinement structure comprising only the Fe-doped InP high resistivity layer 51, in the thermal equilibrium state (FIG. 21(a)) and in the forward biased state (FIG. 21(b)). FIGS. 20(a) and 20(b) are energy band diagrams of an ordinary pn junction in the thermal equilibrium state (FIG. 20(a)) and in the forward biased state (FIG. 20(b)). In these figures, reference character InDE denotes a diffusion current of electrons, InDRa drift current of electrons, IpDE a diffusion current of holes, and IpDR a drift current of holes.

In the BH semiconductor laser, if the light and current confinement region disposed on the opposite sides of the stripe-shaped mesa comprises only the Fe-doped InP high resistivity layer 51 as shown in FIGS. 21(a)-21(b), when a forward bias V for laser oscillation is applied, the Fe-doped InP high resistivity layer 51 serves as a high resistivity current blocking layer that traps electrons, but holes cross a low energy barrier between the Fe-doped InP layer and the underlying p type InP cladding layer and are injected into the Fe-doped InP layer 51 (FIG. 21(b)). The holes recombine with the electrons in the Fe-doped InP layer 51, producing a recombination current. As a result, the Fe-doped InP high resistivity layer 51 loses its current blocking effect.

On the other hand, in the BH semiconductor laser 202 shown in FIG. 16 in which the light and current confinement structure 202b comprises the n type InP current blocking layer 41 and the Fe-doped InP high resistivity layer 51, when a forward bias V is applied across the p side electrode 8 and the n side electrode 7, the height of the pn junction barrier between the p type InP lower cladding layer 1b and the overlying n type InP current blocking layer 41 does not change because the energy band inclines at the Fe-doped InP high resistivity layer 51 and the applied forward bias V is applied to that layer 51.

Therefore, the injection of holes from the p type InP cladding layer 1b to the Fe-doped inP high resistivity layer 51 is prevented, whereby the laser driving current is blocked by the light and current confinement structure 202b and supplied with high efficiency to the active layer 2 in the mesa structure 202a sandwiched by the current confinement structure 202b.

FIG. 18 is a sectional view illustrating a prior art BH semiconductor laser including a light and current confinement structure including a pnpn thyristor. FIGS. 19(a)-19(e) are sectional views illustrating process steps in a method for fabricating the BH laser of FIG. 18.

In FIG. 18, a BH semiconductor laser 203 includes a pnpn thyristor light and current confinement structure 203b disposed on opposite sides of a stripe-shaped mesa structure 202a. The light and current confinement structure 203b comprises a p type InP mesa embedding layer 61 disposed on the p type InP cladding layer 1b, an n type InP current blocking layer 62 disposed on the p mesa embedding layer 61, and a p type InP current blocking layer 63 disposed on the n type InP current blocking layer 62. Other elements are identical to those of the BH laser 202 of FIG. 16.

A description is given of the production process.

The steps illustrated in FIGS. 19(a) and 19(b) are identical to those already described with respect to FIGS. 17(a) and 17(b) and, therefore, repeated description is not necessary.

After formation of the stripe-shaped mesa structure 202a (FIG. 19(b)), the p type inP mesa embedding layer 61 about 0.7 μm thick, the n type InP current blocking layer 62 about 0.8 μm thick, and the p type InP current blocking layer 63 about 1 μm thick are successively grown on the p type InP lower cladding layer 1b at opposite sides of the mesa structure 202a (FIG. 19(c)). These layers are grown by MOCVD. The carrier concentrations of the p type InP mesa embedding layer 61 and the p type InP current blocking layer 63 are about $1 \times 10^{18}$ cm$^{-3}$ and the carrier concentration of the n type InP current blocking layer 62 is about $7 \times 10^{18}$ cm$^{-3}$.

Since the opposite side surfaces of the mesa structure 202a are covered with the p type InP mesa embedding layer 61, the n type InP cladding layer 3a in the mesa structure is electrically separated from the n type InP current blocking layer 62 by the mesa embedding layer 61. The growth of the mesa embedding layer 61 proceeds, forming upper end surfaces 61a in (111)B planes under the SiO$_2$ film 32 and side surfaces 61b in (221)B planes along the side surfaces of the mesa structure.

After removal of the SiO$_2$ film 32 with HF, the second n type InP cladding layer 3b about 1 μm thick is grown on the first n type InP cladding layer 3a and on the p type InP current blocking layer 63 and, successively, the n type InP contact layer 70 about 0.5 μm thick is grown on the second n type InP cladding layer 3b (FIG. 19(d)). These layers are grown by MOCVD.

Thereafter, the insulating film 10 having the window 10a opposite the mesa structure 202a is formed on the n type InP contact layer 70. Finally, the n side electrode 7 is formed contacting the contact layer 70 through the opening 10a and the p side electrode 8 is formed on the rear surface of the p type InP substrate 1, comprising the BH semiconductor laser 203 with the pnpn thyristor light and current confinement structure 203b (FIG. 19(e)).

However, the above-described prior art semiconductor lasers 201 to 203 have the following drawbacks.

In the semiconductor laser 201 shown in FIG. 14, since the Fe-doped semi-insulating InP layer 50 is in contact with the active layer 2 whose conductivity type is changed to p type due to the diffusion of Zn from the p type InP cladding layer 3c, Fe in the InP layer 50 diffuses into the active layer 2 and contaminates the active layer 2, adversely affecting the characteristics of the semiconductor laser. The diffusion length of Fe is about 10 μm while the diffusion length of Zn in the p type InP layer 3d is only 0.3 μm.

Generally, it is difficult to make an ohmic contact between a p type InP layer and a p side electrode. Furthermore, in a semiconductor laser employing an n type InP substrate, the contact area of the p type InP layer and the p side electrode is reduced to reduce the capacitance of the device and increase operating speed, whereby the contact resistance of the p side electrode is increased and the resistance of the whole element is increased, adversely affecting the characteristics of the laser element.

In the semiconductor laser 202 shown in FIG. 16, since the n type InP current blocking layer 41 is in contact with the n type InP cladding layer 3a, reactive current Ir which does not contribute to the laser oscillation flows as shown in FIG. 16, whereby current is not injected into the undoped active layer 2 with high efficiency.

In the semiconductor laser 203 shown in FIG. 18, reactive current Ir flows from the p type InP mesa embedding layer 61 to the n type InP cladding layer 3b. Furthermore, as shown in FIG. 9(a), a depant impurity (Si) accumulates on the side surface of the stripe-shaped mesa 202a shown in FIG. 19(b), and current flows at the side of the undoped active layer 2 through the region including the accumulated dopant impurity. As a result, current is not injected into the undoped active layer 2 with high efficiency.

As described above, in the prior art semiconductor lasers 202 and 203 shown in FIGS. 16 and 18, respectively, since the reactive current flows at the side of the active layer, current is not injected into the active layer with high efficiency, whereby the characteristics and the reliability of the semiconductor laser are degraded.

SUMMARY OF THE INVENTION

It is an object of the present invention to provide a semiconductor laser that prevents dopant impurity atoms in semi-insulating InP current blocking layers disposed on opposite sides of a mesa structure from diffusing into an active layer included in the mesa structure.

It is another object of the present invention to provide a semiconductor laser that reduces the contact resistance between an electrode and a semiconductor layer.

It is still another object of the present invention to provide a semiconductor laser that reduces reactive current and injects current into the active layer with high efficiency.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor laser comprises a stripe-shaped mesa structure comprising a first conductivity type lower cladding layer, an undoped active layer, and a second conductivity type upper cladding layer which are successively disposed on a front surface of a first conductivity type semiconductor substrate, and a light and current confinement structure disposed on the opposite sides of the mesa structure for confining laser light and laser driving current within the mesa, and comprising a first conductivity type mesa embedding layer, a second conductivity type mesa embedding layer, and a semi-insulating semiconductor layer which are successively disposed on the semiconductor substrate contacting the opposite sides of the mesa structure. Therefore, the semi-insulating semiconductor layer is not in contact with the active layer, so that unfavorable diffusion of impurities, such as Fe, Ti, and from the semi-insulating layer, into the active layer is prevented.

According to a second aspect of the present invention, the above-described semiconductor laser includes a p type InP substrate with a p side electrode on its rear surface as the first conductivity type semiconductor substrate. Therefore, the contact area of the p side electrode with the p type substrate, which does not easily make an ohmic contact, is increased, so that the contact resistance of the electrode is reduced.

According to a third aspect of the present invention, in a method for fabricating a semiconductor laser, there are successively grown on a first conductivity type semiconductor substrate an undoped semiconductor layer and a second conductivity type semiconductor layer, a mask layer is formed on a prescribed portion of the second conductivity type semiconductor layer, and the second conductivity type semiconductor layer, the undoped semiconductor layer, and the first conductivity type semiconductor substrate are selectively etched to form a stripe-shaped mesa structure comprising a second conductivity type first upper cladding layer, an undoped active layer, and a first conductivity type lower cladding layer. Thereafter, a first conductivity type mesa embedding layer is grown on the first conductivity type semiconductor substrate contacting opposite sides of the mesa structure, and a second conductivity type mesa embedding layer and a semi-insulating mesa embedding layer are grown on the first conductivity type mesa embedding layer. Finally, a second conductivity type second upper cladding layer is grown on the semi-insulating mesa embedding layer and on the second conductivity type first upper cladding layer.

According to a fourth aspect of the present invention, a semiconductor laser comprises a stripe-shaped mesa structure having opposite side surfaces in (111)B planes, extending along a (110) direction, and comprising part of a first conductivity type lower cladding layer, an undoped active layer, and a second conductivity type upper cladding layer, and a light and current confinement structure comprising a second conductivity type current blocking layer for blocking flow of first charge carriers and a high resistivity semiconductor layer containing a prescribed dopant impurity so that second charge carriers are trapped in the high resistivity layer, which are successively disposed on part of the first conductivity type lower cladding layer at opposite sides of the mesa. An upper edges of the current blocking layer contacting each of the opposite (111)B side surfaces of the mesa is positioned at the boundary between the second conductivity type upper cladding layer and the active layer or a little above the boundary. Therefore, a current path from the second conductivity type upper cladding layer to the second conductivity type current blocking layer is reduced or interrupted, whereby current is injected into the active layer of the mesa structure with high efficiency, improving the characteristics and reliability of the laser. Further, since the impurity-doped high resistivity semiconductor layer is not in contact with the active layer, unfavorable diffusion of impurities into the active layer is prevented.

According to a fifth aspect of the present invention, in a method for fabricating a semiconductor laser, a first conductivity type semiconductor substrate having a front surface in or near (001) plane is prepared, a first conductivity type lower cladding layer, an undoped active layer, and a second conductivity type upper cladding layer are successively grown on the front surface of the semiconductor substrate, a stripe-shaped insulating film is formed along a (110) direction on the second conductivity type upper cladding layer, the upper cladding layer, the active layer, and the lower cladding layer are selectively etched with a prescribed etchant using the insulating film as a mask to form a stripe-shaped mesa having opposite side surfaces in (111)B planes and extending along the (110) direction, a second conductivity type current blocking layer is grown on part of the first conductivity type lower cladding layer at opposite sides of the mesa until an upper edge of the current blocking layer on each of the opposite (111)B side surfaces of the mesa reaches or slightly exceeds the boundary between the second conductivity type upper cladding layer and the active layer, and an impurity-doped high resistivity semiconductor layer is grown on the current blocking layer. In this method, the growth speed of the semiconductor layer on the (111)B surface of the mesa is lower than that on the surface at the opposite sides of the mesa, so that the current blocking layer having the upper edge positioned at the boundary between the upper cladding layer and the active layer is easily formed.

According to a sixth aspect of the present invention, a semiconductor laser comprises a stripe-shaped mesa structure having opposite side surfaces in (111)B planes, extending along a (110) direction, and comprising part of a first conductivity type lower cladding layer, an undoped active layer, and a second conductivity type upper cladding layer, and a light and current confinement structure comprising a second conductivity type current blocking layer and a first conductivity type current blocking layer which are successively disposed on part of the first conductivity type lower cladding layer at opposite sides of the mesa. An upper edge of the second conductivity type current blocking layer on each of the opposite (111)B side surfaces of the mesa is positioned at the active layer or in the vicinity of the active layer. Therefore, a current path from the second conductivity type upper cladding layer to the second conductivity type current blocking layer is reduced or interrupted by the first conductivity type current blocking layer, whereby current is injected into the active layer of the mesa structure with high efficiency, improving the characteristics and reliability of the laser.

According to a seventh aspect of the present invention, in a method for fabricating a semiconductor laser, a semiconductor substrate of a first conductivity type having a front surface in or near a (001) plane is prepared, a first conductivity type lower cladding layer, an undoped active layer, and a second conductivity type upper cladding layer are successively grown on the front surface of the semiconductor substrate, a stripe-shaped insulating film is formed along a (110) direction on the second conductivity type upper cladding layer, the upper cladding layer, the active layer, and the lower cladding layer are selectively etched using the insulating film as a mask to form a stripe-shaped mesa structure having opposite side surfaces in (111)B planes and extending along the (110) direction, a second conductivity type current blocking layer is grown on part of the lower cladding layer at opposite sides of the mesa until an upper edge of the current blocking layer on each of the opposite (111)B side surfaces of the mesa reaches the active layer or the vicinity of the active layer, and a first conductivity type current blocking layer is grown on the second conductivity type current blocking layer. In this method, the growth speed of the semiconductor layer on the (111)B surface of the mesa is lower than that on the flat surface at the opposite sides of the mesa, so that the second conductivity type current blocking layer having the upper edge positioned at the active layer is easily formed.

According to an eighth aspect of the present invention, in a method for fabricating a semiconductor laser, a semiconductor substrate of a first conductivity type having a front surface in or near (001) plane is prepared, a first conductivity type lower cladding layer, an undoped active layer, and a second conductivity type upper cladding layer are successively grown on the front surface of the semiconductor substrate, a stripe-shaped insulating film is formed along a (110) direction on the second conductivity type upper cladding layer, the upper cladding layer, the active layer, and the lower cladding layer are selectively etched using the insulating film as a mask to form a stripe-shaped mesa structure having opposite side surfaces in (111)B planes and extending along the (110) direction, a second conductivity type current blocking layer is grown on part of the lower cladding layer at opposite sides of the mesa the until an upper edge of the current blocking layer on each of the opposite (111)B side surfaces of the mesa reaches or slightly exceeds the boundary between the second conductivity type upper cladding layer and the active layer, and an impurity-doped high resistivity semiconductor layer and a second conductivity type mesa embedding layer are grown on the current blocking layer so that the surface of the mesa embedding layer is even with the upper surface of the mesa. Therefore, the second conductivity type current blocking layer is in electrical contact with the second conductivity type upper cladding layer, whereby the process of forming the cladding layer is simplified.

According to a ninth aspect of the present invention, in a method for fabricating a semiconductor laser, a semiconductor substrate of a first conductivity type having a front surface in or near a (001) plane is prepared, a first conductivity type lower cladding layer, an undoped active layer, and a second conductivity type upper cladding layer are successively grown on the front surface of the semiconductor substrate, a first cap layer of a different composition from the upper cladding layer is formed on the upper cladding layer, and a second cap layer of a different composition from the first cap layer is formed on the first cap layer. After removal of the second cap layer, a stripe-shaped insulating film is formed along a (110) direction on the first cap layer and, using the stripe-shaped insulating film as a mask, the first cap layer, the upper cladding layer, the active layer, and the lower cladding layer are selectively etched to form a stripe-shaped mesa having opposite side surfaces in (111)B, planes and extending along the (110) direction. Thereafter, a second conductivity type current blocking layer is grown on part of the lower cladding layer at opposite sides of the mesa until an upper edge of the current blocking layer on each of the opposite (111)B side surfaces of the mesa reaches or slightly exceeds the boundary between the second conductivity type upper cladding layer and the active layer, and an impurity-doped high resistivity semiconductor layer is grown on the current blocking layer so that the surface of the high resistivity layer is even with the upper surface of the mesa. In this method, since the first cap layer that is damaged by the formation of the stripe-shaped insulating film is removed, the top surface of the mesa structure is not adversely affected by the formation of the insulating film.

According to a tenth aspect of the present invention, in the above-described methods for fabricating a semiconductor laser, the stripe-shaped mesa structure is formed by etching the upper cladding layer, the active layer, and the lower cladding layer in an HCl gas phase etching process.

According to an eleventh aspect of the present invention, in the above-described methods for fabricating a semiconductor laser, the mesa structure is formed by etching the upper cladding layer, the active layer, and the lower cladding layer with a mixture of HCl, $CH_3COOH$, and $H_2O_2$.

According to a twelfth aspect of the present invention, a semiconductor laser comprises a stripe-shaped mesa structure having opposite side surfaces in (111)B planes, extending along a (110) direction, and a second conductivity type lower cladding layer, an undoped active layer, and a first conductivity type upper cladding layer, and a light and current confinement structure comprising a high resistivity semiconductor layer containing a prescribed dopant impurity so that second charge carriers are trapped in the high resistivity layer and a second conductivity type current blocking layer for blocking first charge carriers, which are successively disposed on part of the second conductivity type lower cladding layer at opposite sides of the mesa. An upper edge of the high resistivity semiconductor layer on each of the opposite (111)B side surfaces of the mesa is positioned at the boundary between the first conductivity type upper cladding layer and the active layer or a little beneath the boundary. Therefore, a current path from the second conductivity type lower cladding layer to the second conductivity type current blocking layer is reduced or interrupted, whereby current is injected into the active layer in the mesa structure with high efficiency, improving characteristics and reliability of the laser. Further, since the impurity-doped high resistivity semiconductor layer is not in contact with the active layer, the unfavorable diffusion of impurities into the active layer is prevented.

According to a thirteenth aspect of the present invention, in a method for fabricating a semiconductor laser, a second conductivity type semiconductor substrate having a front surface in or near a (001) plane is prepared, a second conductivity type lower cladding layer, an undoped active layer, and a first conductivity type upper cladding layer are successively grown on the front surface of the semiconductor substrate, and a stripe-shaped insulating film is formed on the first conductivity type upper cladding layer along a (110) direction. Using the stripe-shaped insulating film as a mask, the upper cladding layer, the active layer, and the lower cladding layer are selectively etched to form a stripe-shaped mesa having opposite side surfaces in (111)B planes and extending along the (110) direction. Thereafter, a high resistivity semiconductor layer containing a prescribed dopant impurity so that second charge carriers are trapped in the high resistivity layer, is grown on part of the second conductivity type lower cladding layer at opposite sides of the mesa so that an upper edge of the high resistivity semiconductor layer on each of the opposite (111)B side surfaces of the mesa is positioned at the boundary between the upper cladding layer and the active layer or a little beneath the boundary, and a second conductivity type current blocking layer for blocking first charge carriers is formed on the high resistivity semiconductor layer. In this method, the growth speed of the semiconductor layer on the (111)B surface of the mesa is lower than that on the flat surface at the opposite sides of the mesa, so that the high resistivity semiconductor layer having the upper edge positioned at the boundary between the lower cladding layer and the active layer is easily formed.

BRIEF DESCRIPTION OF THE DRAWINGS

FIGS. 13(a)–13(e) are sectional views illustrating process steps in a method for producing the semiconductor laser of FIG. 12.

FIGS. 19(a)–19(e) are sectional views illustrating process steps in a method for producing the semiconductor laser of FIG. 18.

FIGS. 22(a) and 22(b) are energy band diagrams of a laminated semiconductor structure comprising p-InP, n-InP, Fe-doped InP, and n-InP included in a semiconductor laser according to the prior art.

DETAILED DESCRIPTION OF THE PREFERRED EMBODIMENTS

Figure 1:
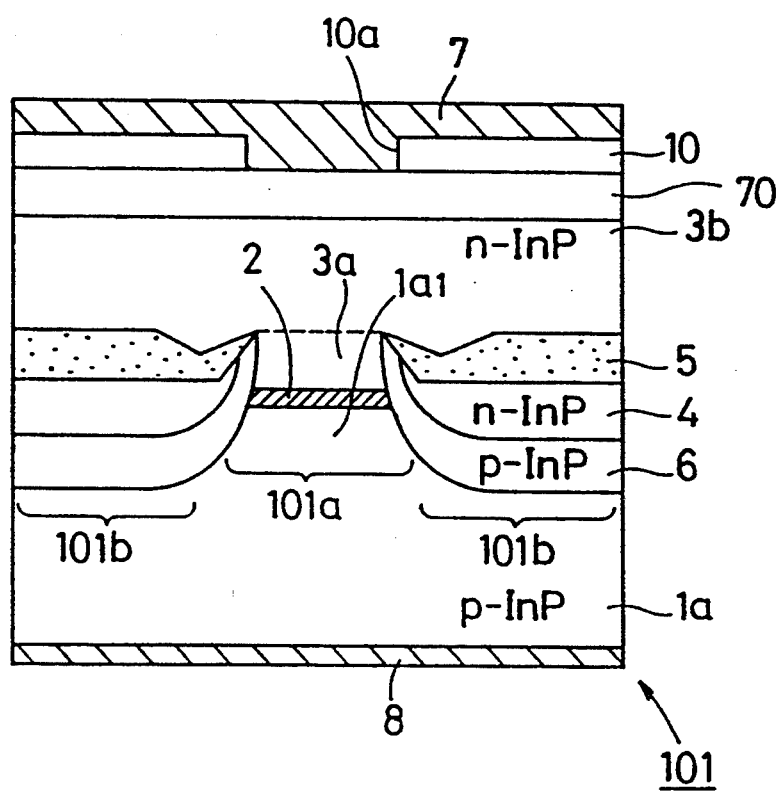
FIG. 1 is a sectional view illustrating a semiconductor laser in accordance with a first embodiment of the present invention.

FIG. 1 is a sectional view illustrating a semiconductor laser in accordance with a first embodiment of the present invention. FIGS. 2(a)–2(e) are sectional views illustrating process steps in a method for producing the semiconductor laser of FIG. 1.

In these figures, a buried heterostructure (BH) semiconductor laser 101 includes a stripe-shaped mesa structure 101a in which laser oscillation occurs, and a light and current confinement structure 101b disposed on opposite sides of the mesa structure 101a for confining laser light and laser operating current within the mesa structure 101a.

The stripe-shaped mesa 101a comprises a mesa part $1a_1$ of a p type InP substrate 1a (p type InP lower cladding layer), an undoped InGaAsP active layer 2 disposed on the mesa part $1a_1$, and a first n type InP upper cladding layer 3a disposed on the active layer 2. The light and current confinement structure 101b comprises a p type InP layer 6 which is disposed on the p type InP substrate 1a contacting opposite sides of the stripe-shaped mesa 101a, an n type InP layer 4 disposed on the layer 6, and an Fe-doped semi-insulating InP layer 5 disposed on the layer 4. In place of the Fe-doped semi-insulating InP layer, a cobalt(Co)-doped or vanadium(V)-doped semi-insulating InP layer may be employed.

A second n type InP cladding upper layer 3b is disposed on the semi-insulating InP layer 5 of the light and current confinement structure 101b as well as on the n type InP cladding layer 3a of the mesa structure 101a. An n type InP contact layer 70 is disposed on the second n type InP cladding layer 3b. An insulating film 10 having a window 10a opposite the mesa structure 101a is disposed on the contact layer 70. An n side electrode 7 comprising CrAu alloy is disposed on the insulating film 10 contacting the InP contact layer 70 through the window 10a of the insulating film 10, and a p side electrode 8 comprising AuZn alloy is disposed on the rear surface of the substrate 1a.

A description is given of the production process.

Figure 2D:
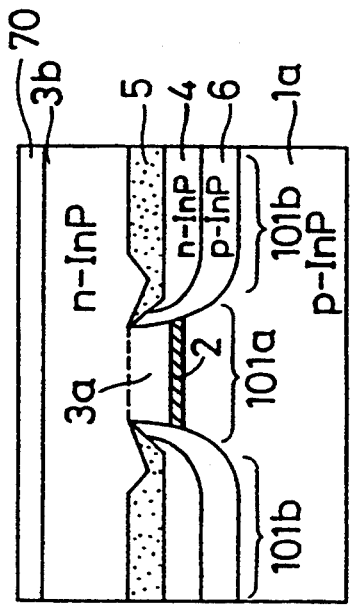
FIGS. 2(a)–2(e) are sectional views illustrating process steps in a method for producing the semiconductor laser of FIG. 1.
Figure 2E:
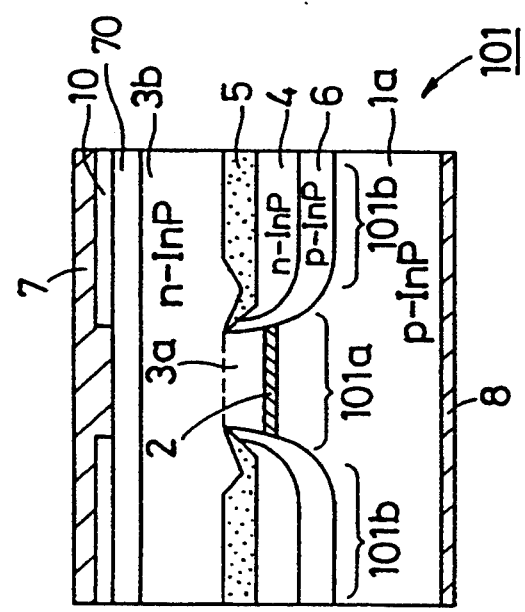
Figure 2A:
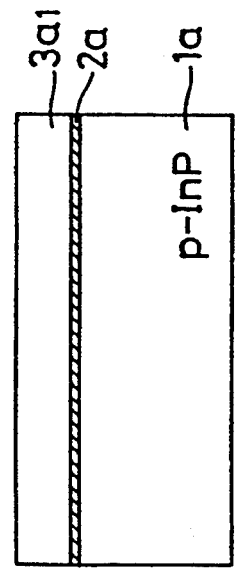
Figure 2B:
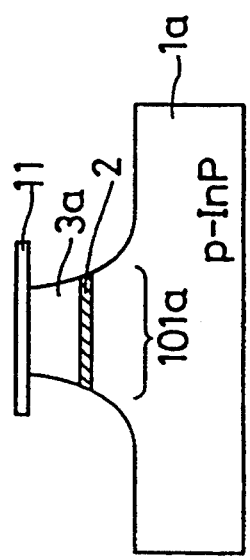

Initially, as illustrated in FIG. 2(a), an undoped InP layer 2a about 0.1 μm thick and an n type InP layer $3a_1$ about 0.5 μm thick are successively grown on the p type InP substrate 1a with a carrier concentration of about $4 \times 10^{18}$ cm$^{-3}$ (first crystal growth). The n type InP layer $3a_1$ has a carrier concentration of $1 \times 10^{18}$ cm$^{-3}$. Then, an insulating film 11 is formed on the n type InP layer $3a_1$ by conventional photolithographic techniques. Using the insulating film 11 as a mask, the n type InP layer $3a_1$, the undoped InGaAsP layer 2, and the p type InP substrate 1a are selectively etched to form the stripe-shaped mesa 101a including the active layer 2 and the first n type InP cladding layer 3a (FIG. 2(b)).

Figure 2C:
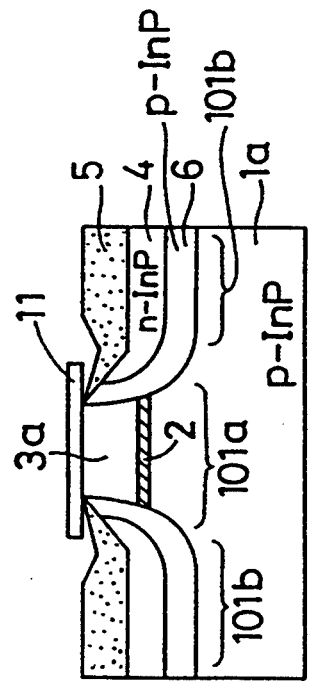

In the step of FIG. 2(c), the p type InP layer 6 about 0.7 μm thick, the n type InP layer 4 about 0.8 μm thick, and the semi-insulating InP layer 5 about 3 μm thick are successively grown on the p type InP substrate 1a at the opposite sides of the mesa structure 101a (second crystal growth), completing the light and current confinement structure 101b. After removal of the insulating film 11, the second n type InP cladding layer 3b about 1 μm thick is grown on the first n type InP cladding layer 3a as well as on the semi-insulating InP layer 5 and, successively, the n type InP contact layer 70 about 0.5 μm thick is grown on the cladding layer 3b (FIG. 2(d)).

The p type InP mesa embedding layer 6 and the second n type InP cladding layer 3b have a carrier concentration of about $1 \times 10^{18}$ cm$^{-3}$, the n type InP mesa embedding layer 4 and the n type InP contact layer 70 have a carrier concentration of about $7 \times 10^{18}$ cm$^{-3}$, and the Fe-doped semi-insulating InP mesa embedding layer 5 has a carrier concentration of about $4 \times 10^{16}$ cm$^{-3}$.

Thereafter, the insulating film 10 having the window 10a opposite the mesa structure 101a is formed on the n type InP contact layer 70. Finally, the n side electrode 7 is formed on the insulating film 10 contacting the n type InP contact layer 70 through the window 10a and the p side electrode 8 is formed on the rear surface of the p type InP substrate 1a, completing the BH semiconductor laser 101 (FIG. 2(e)).

In the semiconductor laser 101 according to the first embodiment of the present invention, the p type InP mesa embedding layer 6 and the n type InP mesa embedding layer 4 are disposed on the p type InP substrate 1a, contacting the opposite sides of the mesa structure 101a, and the Fe-doped semi-insulating InP layer 5 having a deep energy level that captures, i.e., traps electrons is disposed on the n type InP layer 4, so that the Fe-doped semi-insulating InP layer 5 is not in contact with the active layer 2 exposed the side surface of the mesa 101a. Therefore, the unfavorable diffusion of Fe into the active layer 2, which adversely affects the laser characteristics, is suppressed.

Further, since the semi-insulating InP mesa embedding layer 5 included in the light and current confinement structure 101b has a deep energy level that captures electrons, the reactive current flowing by the side of the active layer 2 is suppressed, resulting in a high-efficiency semiconductor laser.

Further, since the p type InP substrate 1a is employed and the p side electrode 8 is formed over the rear surface of the p type InP substrate, the contact area of the p side electrode and the p type semiconductor layer is increased, whereby the contact resistance of the electrode is reduced, improving the characteristics of the semiconductor laser.

Figure 3A:
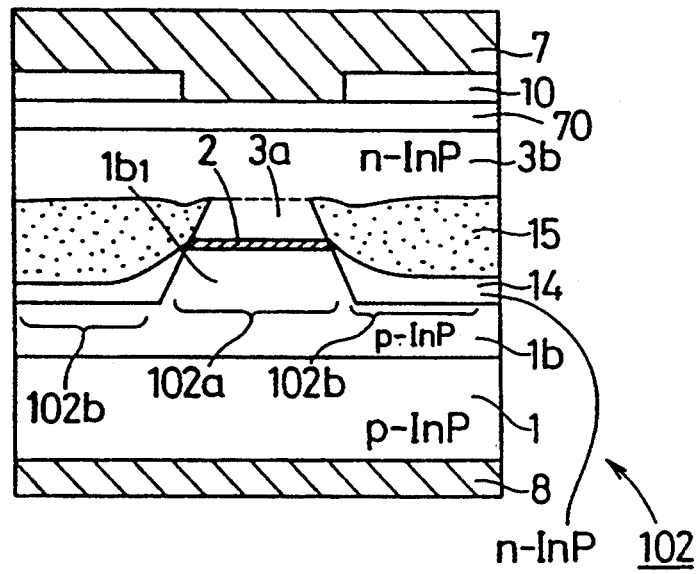
FIGS. 3(a)–3(c) are diagrams for explaining a semiconductor laser in accordance with a second embodiment of the present invention.
Figure 3B:
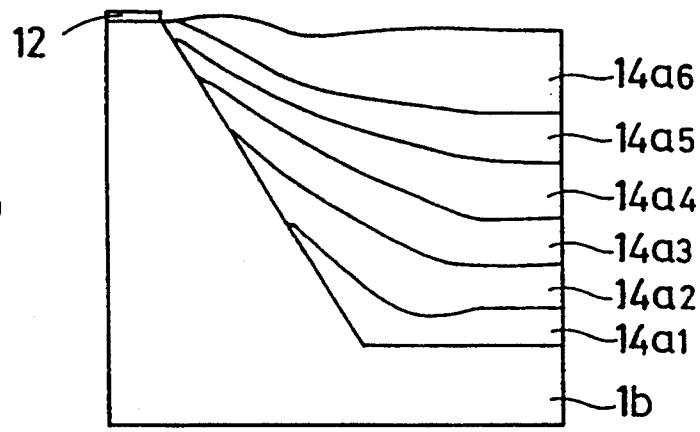
Figure 3C:
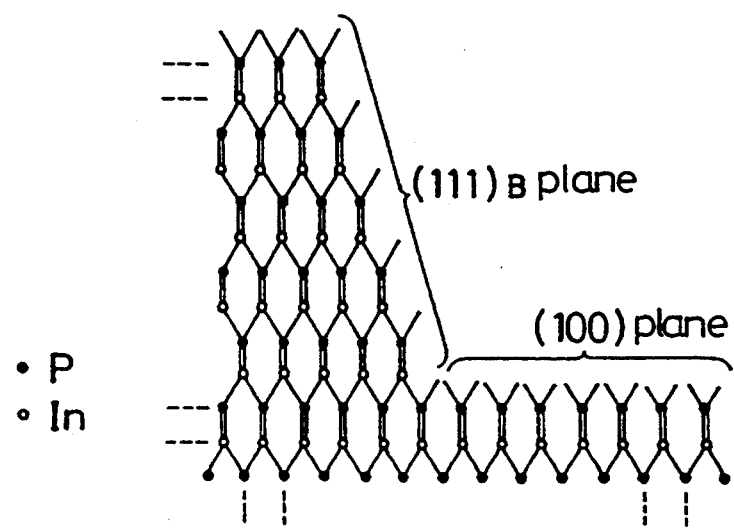

FIGS. 3(a)-3(c) are diagrams illustrating a semiconductor laser in accordance with a second embodiment of the present invention. FIGS. 4(a)-4(e) are sectional views illustrating process steps in a method for producing the semiconductor laser of the second embodiment.

In FIG. 3(a), a semiconductor laser 102 includes a p type InP substrate 1 having a surface in or near a (001) plane. A p type InP lower cladding layer 1b having a mesa part $1b_1$ is disposed on the p type InP substrate 1. An undoped InGaAsP active layer 2 is disposed on the mesa part $1b_1$ of the cladding layer 1b. A first n type InP upper cladding layer 3a is disposed on the active layer 2. A stripe-shaped mesa structure 102a comprises the mesa part $1b_1$ of the lower cladding layer 1b, the active layer 2, and the first upper cladding layer 3a. The stripe-shaped mesa 102a extends along the (110) direction and has opposite side surfaces in (111)B planes.

A light and current confinement structure 102b for confining laser light and laser driving current within the active layer 2 of the mesa structure 102a is disposed on the p type InP lower cladding layer 1b, contacting the opposite sides of the mesa structure 102a. This light and current confinement structure 102b comprises an n type InP current blocking layer 14 disposed on the lower cladding layer 1b and an Fe-doped high resistivity semiconductor layer 15 disposed on the current blocking layer 14. In this light and current confinement structure 102b, holes (first charge carriers) are blocked by a pn junction of the lower cladding layer 1b and the current blocking layer 14 and electrons (second charge carriers) are trapped in the high resistivity semiconductor layer 15.

An upper edge of the n type InP current blocking layer 14 on the (111)B side surface of the mesa 102a is positioned at the boundary between the active layer 2 and the n type InP upper cladding layer 3a.

A description is given of the production process.

Figure 4A:
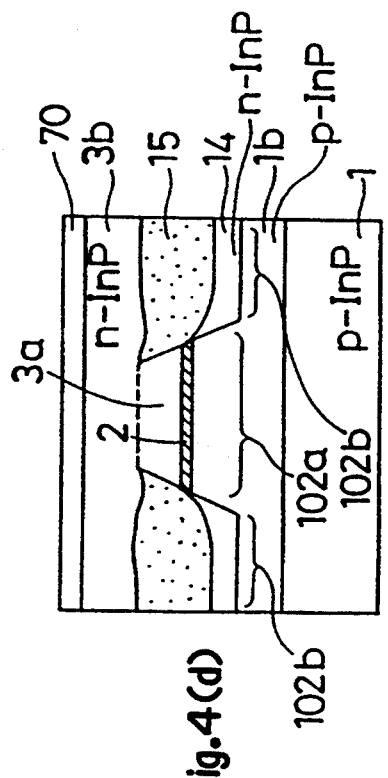
FIGS. 4(a)–4(e) are sectional views illustrating process steps in a method for producing the semiconductor laser according to the second embodiment.

Initially, as illustrated in FIG. 4(a), a p type InP layer 1b 2 μm thick having a carrier concentration of $1 \times 10^{18}$ cm$^{-3}$, an undoped InGaAsP layer 2a 0.1 μm thick, and an n type InP layer $3a_1$ 0.5 μm thick with a carrier concentration of $1 \times 10^{18}$ cm$^{-3}$ are successively grown on the p type InP substrate 1 in an MOCVD furnace. Thereafter, an SiO$_2$ film is deposited on the n type InP layer $3a_1$ and patterned by conventional photolithographic techniques, forming a stripe-shaped SiO$_2$ mask 12 along the (110) direction.

Figure 4B:
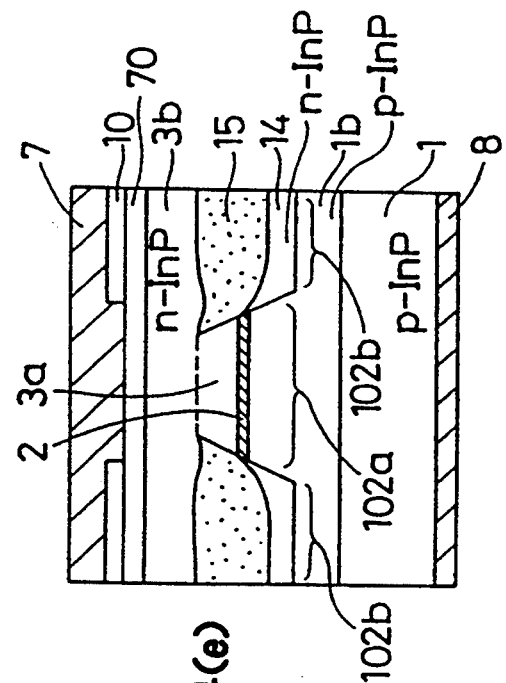
Figure 4C:
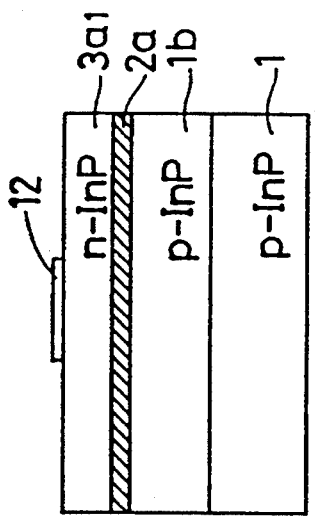

Using the SiO$_2$ mask 12, the n type InP layer $3a_1$, the InGaAsP layer 2a, and the p type InP layer 1b are successively etched by HCl gas phase etching, to a depth of 2.5 μm from the surface of the n type InP layer $3a_1$, forming the stripe-shaped mesa structure 102a (FIG. 4(b)). The angle θ between the side surface and the top surface of the mesa 102a is about 55°, and the (111)B plane appears at the side surface of the mesa.

After the etching process, the p type InP substrate 1 with the mesa structure 102a is put in the MOCVD furnace without exposing the substrate to oxygen (air). In the MOCVD furnace, the n type InP current blocking layer 14 about 1 μm thick having a carrier concentration of $7 \times 10^{18}$ cm$^{-3}$ and the Fe-doped InP high resistivity film 15 about 1.5 μm thick having a carrier concentration of $4 \times 10^{16}$ cm$^{-3}$ are successively grown on the p type InP lower cladding layer 1b contacting the opposite side surfaces of the mesa 102a, forming the light and current confinement structure 102b (FIG. 4(c)).

Since the surface of the p type InP lower cladding layer 1b at both sides of the mesa 102a is in the (100) plane and the side surface of the mesa 102a is in the (111)B plane as shown in FIG. 3(c), the InP current blocking layer 14 does not directly grow on the side surface of the mesa 102a but grows on the flat surface of the p type InP cladding layer 1b in the MOCVD process. Therefore, the growth of the InP current blocking layer 14 proceeds as illustrated in FIG. 3(b), i.e., InP layers $14a_1$ to $14a_6$ are successively grown so that the edge of each InP layer on the side surface of the mesa 102a gradually accumulated upward along the side surface of the mesa.

The reason why InP does not directly grow on the (111)B surface of the InP layer but directly grows on the (100) surface is that each P atom has two bonds on the (100) surface but it has only one bonds on the (111)B surface, as shown in FIG. 3(c).

Figure 4D:
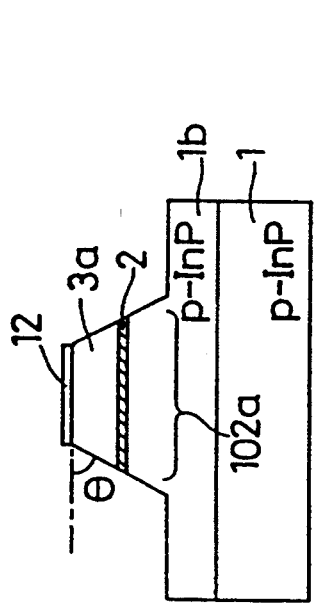

After removal of the SiO₂ mask 12 with HF, the second n type InP upper cladding layer 3b about 1 μm thick is grown on the first n type InP upper cladding layer 3a of the mesa structure 102a as well as on the InP high resistivity layer 15 of the light and current confinement structure 102b and, successively, the n type InP contact layer 70 about 0.5 μm thick is grown on the cladding layer 3b in the MOCVD furnace (FIG. 4(d)).

Figure 4E:
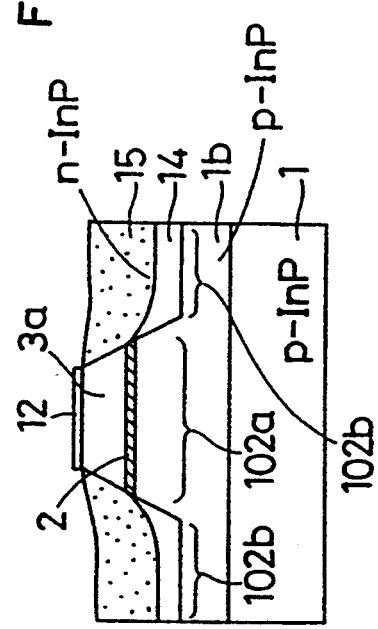

To complete the semiconductor laser 102, the n side electrode 7 is formed on the n type InP contact layer 70 and the p side electrode 8 is formed on the rear surface of the p type InP substrate 1 (FIG. 4(e)).

In the semiconductor laser 102 according to this second embodiment of the present invention, the edge of the n type InP current blocking layer 14 on the side surface of the mesa structure 102a is positioned at the boundary between the first n type InP upper cladding layer 3a and the active layer 2. In this structure, the width of the current path from the first n type InP upper cladding layer 3a to the n type InP current blocking layer 14 is reduced, whereby the reactive current flowing by the side of the active layer is suppressed.

Further, the upper edge of the n type InP current blocking layer 14 on the (111)B side surface of the mesa 102a is positioned at the boundary between the active layer 2 and the n type InP upper cladding layer 3a, so that the Fe doped semi-insulating InP layer 15 is not in contact with the active layer 2 exposed at the side surface of the mesa 102a. Therefore, the unfavorable diffusion of Fe into the active layer 2 is suppressed, thereby preventing the crystalline quality of the active layer 2 from degrading.

Further, since the side surface of the mesa structure 102a formed in the HCl gas phase etching process is in the (111)B plane as shown in FIG. 3(c), the n type InP current blocking layer 14 does not grow over the side surface of the mesa 102a but grows from the bottom of the mesa, i.e., from the flat surface of the p type InP lower cladding layer 1b. Therefore, the structure in which the n type InP upper cladding layer 3a is not in contact with the n type InP current blocking layer 14 as shown in FIG. 3(a) is easily produced by switching the growth of the InP current blocking layer 14 to the growth of the Fe-doped high resistivity InP when the edge of the layer 14 on the side surface of the mesa 102a reaches the boundary between the active layer 2 and the upper cladding layer 3a.

Although in the above-described second embodiment the semiconductor laser 102 includes the p type InP substrate 1 and the Fe-doped semi-insulating InP layer, the same effects as described above are achieved if the laser includes an n type InP substrate, a Ti-doped semi-insulating InP layer, and other layers of opposite conductivity types.

While in the above-described second embodiment the edge of the n type InP current blocking layer 14 on the side surface of the mesa 102a is positioned at the boundary between the active layer 2 and the upper cladding layer 3a, the edge of the current blocking layer 14 may be positioned above and in the vicinity of the boundary.

Figure 5:
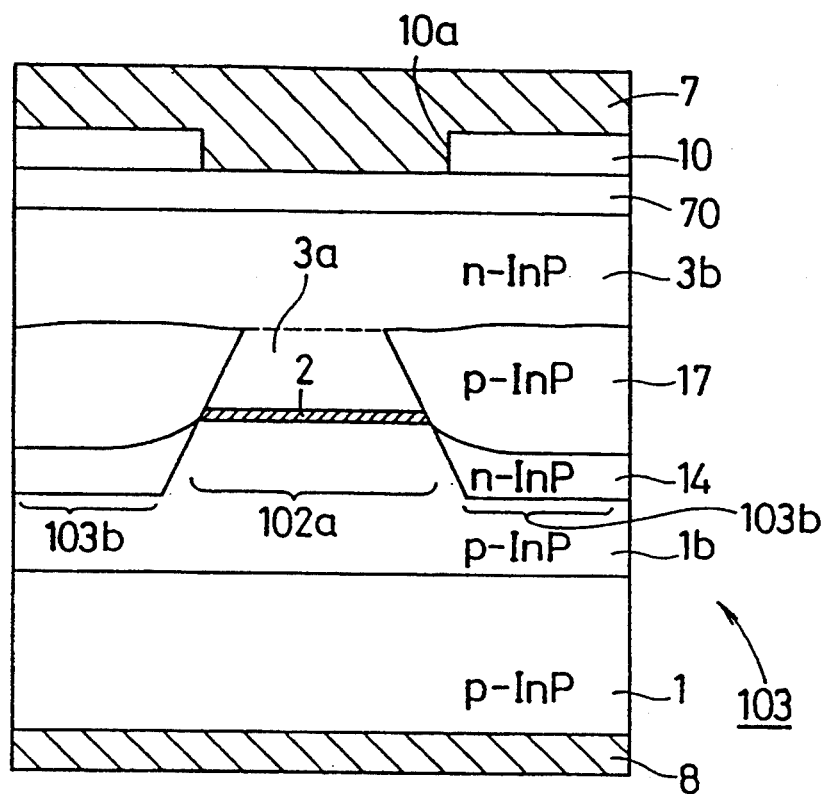
FIG. 5 is a sectional view illustrating a semiconductor laser in accordance with a third embodiment of the present invention.

FIG. 5 is a sectional view illustrating a semiconductor laser in accordance with a third embodiment of the present invention. FIGS. 6(a)-6(e) are sectional views illustrating process steps in a method for fabricating the laser of FIG. 5.

In this third embodiment, a semiconductor laser 103 includes a p type InP current blocking layer 17 in place of the Fe-doped InP mesa embedding layer 15 in the light and current confinement structure 102b of the semiconductor laser 102 according to the second embodiment. Other elements of the laser 103 are identical to those of the laser 102 of the second embodiment.

A description is given of the production process.

Figure 6A:
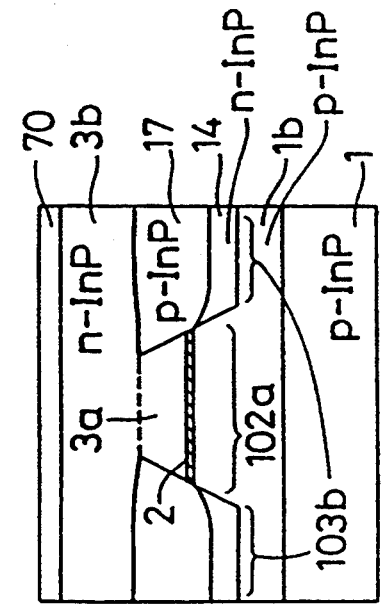
FIGS. 6(a)–6(e) are sectional views illustrating process steps in a method for producing the semiconductor laser of FIG. 5.
Figure 6B:
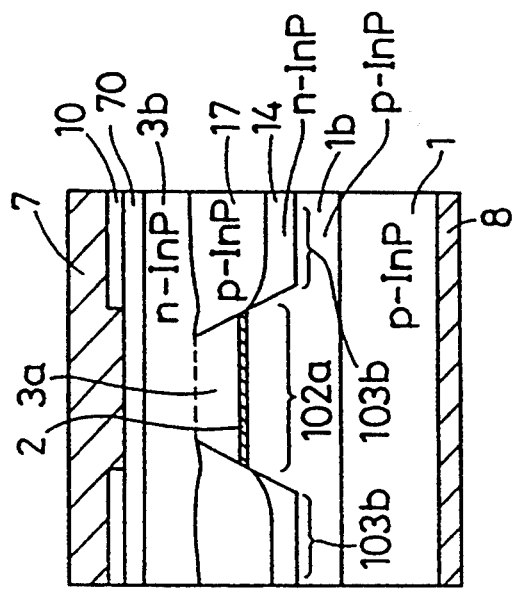

The steps illustrated in FIGS. 6(a) and 6(b) are identical to those already described with respect to FIGS. 4(a) and 4(b) and, therefore, repeated description is not necessary. After formation of the stripe-shaped mesa structure 102a, the n type InP current blocking layer 14 about 1 μm thick having a carrier concentration of $7 \times 10^{18}$ cm$^{-3}$ is grown on the p type InP lower cladding layer 1b, contacting the opposite side surfaces of the mesa 102a, until the upper edge of the layer 14 on each side surface of the mesa 102a reaches the boundary between the active layer 2 and the upper cladding layer 3a and, successively, the p type InP current blocking layer 17 about 1.5 μm thick with a carrier concentration of $1 \times 10^{18}$ cm$^{-3}$ is grown on the current blocking layer 14, completing the light and current confinement structure 103b (FIG. 6(c)). These layers 14 and 17 are grown by MOCVD.

Figure 6C:
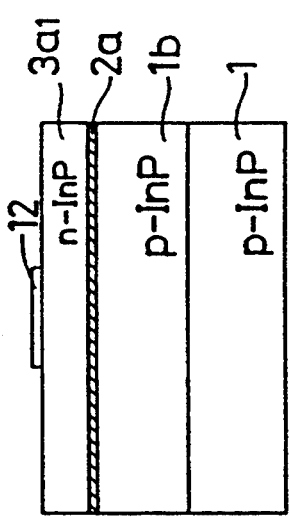
Figure 6D:
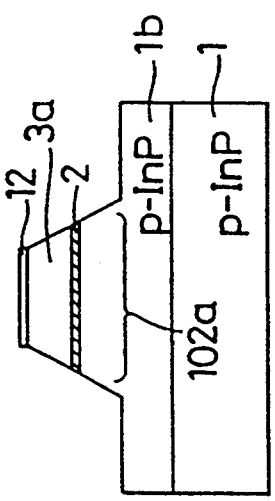
Figure 6E:
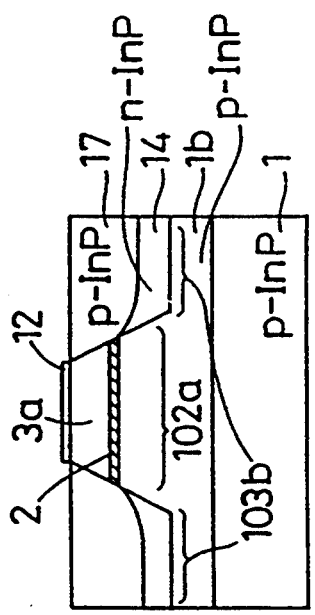

To complete the semiconductor laser 103 shown in FIG. 5, the n type InP cladding layer 3b and the n type InP contact layer 70 are grown (FIG. 6(d)), followed by the formation of the n side electrode 7 and the p side electrode 8 (FIG. 6(e)).

According to the third embodiment of the present invention, in the light and current confinement structure 103b comprising the n type InP current blocking layer 14 and the p type InP current blocking layer 17, the edge of the n type InP current blocking layer 14 on the (111)B side surface of the mesa 102a is positioned at the boundary between the InGaAsP active layer 2 and the n type InP upper cladding layer 3a. In this structure, the current path from the n type InP upper cladding layer 3a to the n type InP current blocking layer 14 is interrupted by the p type InP current blocking layer 17, whereby reactive current flowing by the side of the undoped active layer 2 is suppressed and current is injected into the active layer with high efficiency, improving the characteristics and reliability of the semiconductor laser.

Furthermore, in the production process of the semiconductor laser 103, the stripe-shaped mesa 102a is formed so that the opposite side surfaces of the mesa are in (111)B planes, and the n type InP current blocking layer 14 and the p type InP current blocking layer 17 are grown contacting the (111)B side surfaces of the mesa 102a. Therefore, the growth speed of these InP layers on the (111)B side surface is suppressed compared with the growth speed on the flat surface of the p type InP lower cladding layer 1b at the opposite sides of the mesa 102a. Accordingly, the n type InP current blocking layer 14 having an edge on the (111)B side surface positioned at the boundary between the active layer 2 and the upper cladding layer 3a is easily formed.

Figure 9A:
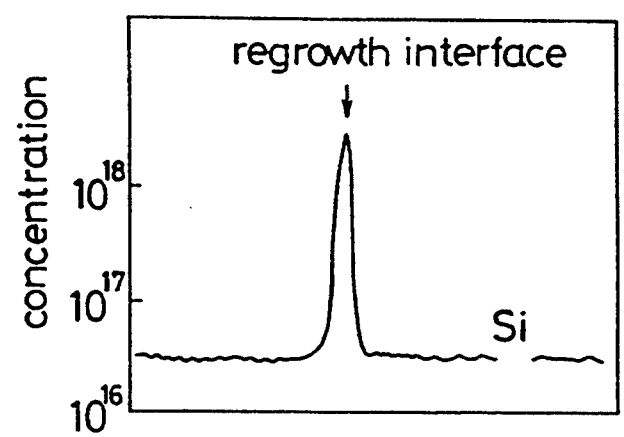
FIGS. 9(a) and 9(b) are diagrams illustrating impurities accumulated on a regrowth interface.
Figure 9B:
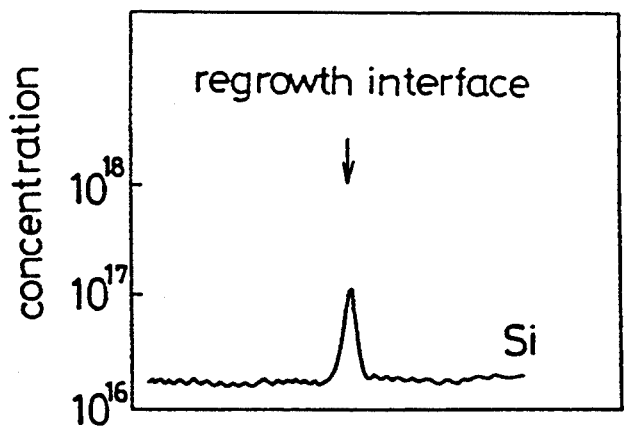

Since the formation of the mesa structure (FIG. 6(b)) and the selective growth for embedding the mesa structure (FIG. 6(c)) are carried out without exposing the wafer to oxygen (air), the accumulation of Si on the regrowth interface is reduced as shown by comparing FIG. 9(b) to FIG. 9(a), whereby reactive current flowing through Si is reduced.

Figure 7:
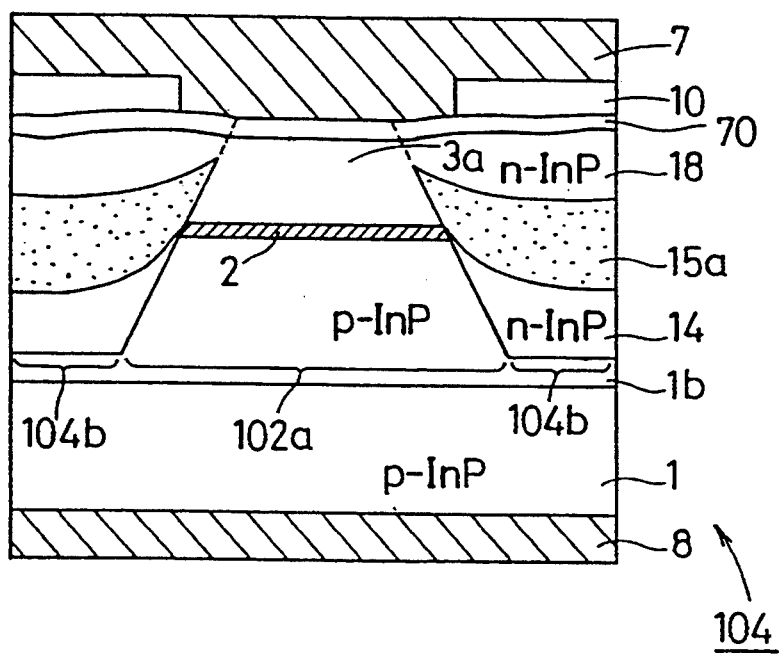
FIG. 7 is a sectional view illustrating a semiconductor laser in accordance with a fourth embodiment of the present invention.

FIG. 7 is a sectional view illustrating a semiconductor laser in accordance with a fourth embodiment of the present invention. FIGS. 8(a)-8(d) are sectional views illustrating process steps in a method for fabricating the semiconductor laser of FIG. 7.

In FIG. 7, a semiconductor laser 104 according to this fourth embodiment includes an Fe-doped InP mesa embedding layer 15a and an n type InP mesa embedding layer 18 which are successively disposed on the n type InP current blocking layer 14, in place of the Fe-doped InP mesa embedding layer 15 of the semiconductor laser 102 according to the second embodiment. Other elements of the laser 104 are identical to those of the laser 102 of the second embodiment.

A description is given of the production process.

Initially, there are successively grown on the p type InP substrate 1, a p type InP cladding layer 1b, an undoped InGaAsP layer 2a, an n type InP layer 3a₁, and an n type InP layer 71a having a carrier concentration of $7 \times 10^{18}$ cm$^{-3}$. Thereafter, an SiO$_2$ film is deposited on the InP layer 71a by sputtering and patterned by conventional photolithographic techniques, forming a stripe-shaped SiO$_2$ mask 12 along the (110) direction (FIG. 8(a)).

Figure 8A:
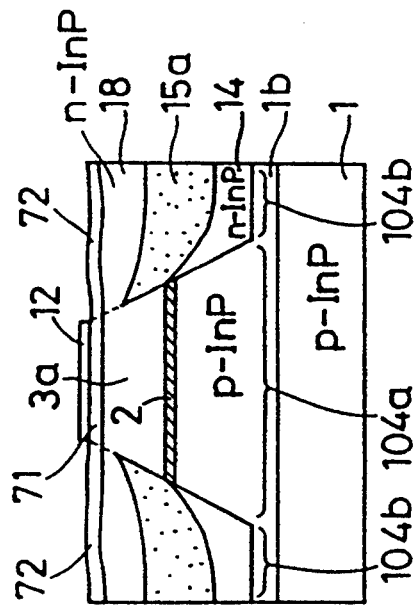
FIGS. 8(a)–8(d) are sectional views illustrating process steps in a method for producing the semiconductor laser of FIG. 7.
Figure 8C:
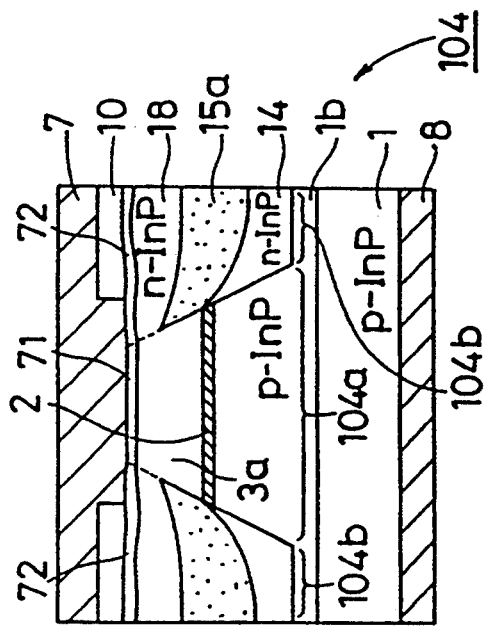
Figure 8B:
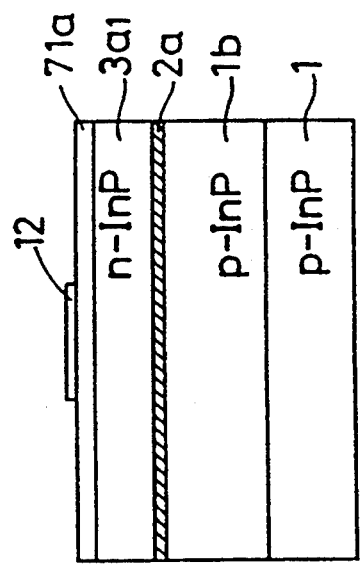

Thereafter, the n type InP layer 71a, the n type InP layer 3a₁, the InGaAsP layer 2a, and the p type InP cladding layer 1b are successively etched by HCl gas phase etching to a depth of about 2.5 μm from the surface of the n type InP layer 71a, forming a stripe-shaped mesa structure 104a (FIG. 8(b)).

After the etching process, the p type InP substrate 1 having the mesa structure 104a is put in the MOCVD furnace without exposing the substrate to oxygen (air). In the MOCVD furnace, the n type InP current blocking layer 14 about 1 μm thick with a carrier concentration of $7 \times 10^{18}$ cm$^{-3}$ is grown contacting the opposite side surfaces of the mesa 104a until the edge of the layer 14 on the side surface of the mesa reaches the boundary between the active layer 2 and the upper cladding layer 3a and, successively, an Fe-doped InP high resistivity layer 15a about 1.5 μm thick and having a carrier concentration of $4 \times 10^{16}$ cm$^{-3}$ is grown on the n type InP current blocking layer 14. Subsequently, the n type InP layer 18 about 1 μm thick having a carrier concentration of $1 \times 10^{18}$ cm$^{-3}$ and the n type InP layer 72 about 0.5 μm thick having a carrier concentration of $7 \times 10^{18}$ cm$^{-3}$ are grown on the high resistivity layer 15a, whereby the light and current confinement structure 104b is produced (FIG. 8(c)).

Figure 8D:
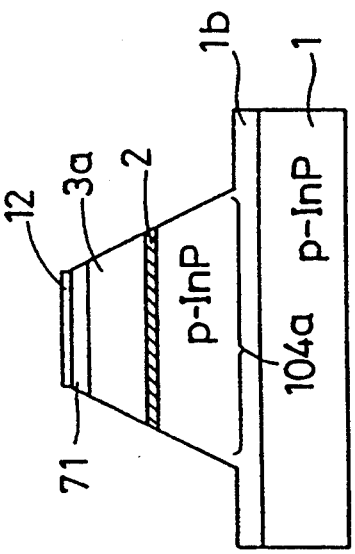

To complete the semiconductor laser 104, the n side electrode 7 is formed on the n type InP contact layers 71 and 72 through the window of the insulating film 10 and the p side electrode 8 is formed on the rear surface of the p type InP substrate 1 (FIG. 8(d)).

According to the fourth embodiment of the present invention, since the first n type InP mesa embedding layer 14, the Fe-doped InP layer 15a, and the second n type InP mesa embedding layer 18 are grown contacting the opposite (111)B side surfaces of the mesa structure 104a, the same effects as described in the second embodiment are achieved. In addition, since the second n type InP mesa embedding layer 18 is electrical contact with the n type InP upper cladding layer 3a, the process of forming the second upper cladding layer 3b in the second embodiment can be dispensed with. That is, the laser structure 104 is achieved through only two crystal growth processes while three crystal growth processes are required in the second embodiment.

While in the above-described fourth embodiment the n type InP mesa embedding layer 18 is formed on the Fe-doped InP mesa embedding layer 15a which corresponds to the Fe-doped InP mesa embedding layer 15a of the second embodiment, this layer 18 may be formed on the p type InP current blocking layer 17 of FIG. 5 according to the third embodiment.

Figure 10:
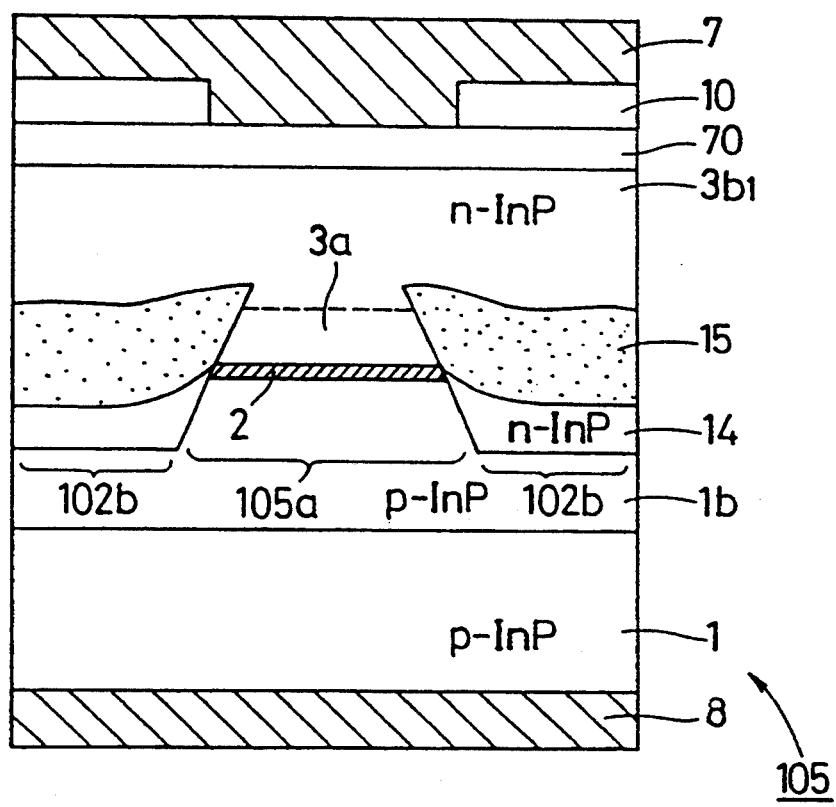
FIG. 10 is a sectional view illustrating a semiconductor laser in accordance with a fifth embodiment of the present invention.

FIG. 10 is a sectional view illustrating a semiconductor laser in accordance with the fifth embodiment of the present invention. FIGS. 11(a)-11(f) are sectional views illustrating process steps in a method for fabricating the semiconductor laser of FIG. 10.

In these figures, the same reference numerals as those in FIGS. 3(a) and 4(a)-4(e) designate the same or corresponding parts. A semiconductor laser 105 of this fifth embodiment has the same structure as the laser 102 of the second embodiment shown in FIG. 3(a). A difference between these lasers 105 and 102 resides in the production of the mesa structure. That is, in this fifth embodiment, when the stripe-shaped mesa structure 105a is formed, an n type InP cap layer 13 is interposed between the first n type InP cladding layer 3a and the SiO$_2$ mask 12.

The production process will be described in more detail.

Figure 11A:
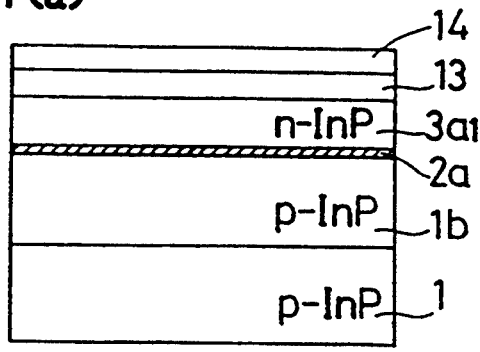
FIGS. 11(a)–11(f) are sectional views illustrating process steps in a method for producing the semiconductor laser of FIG. 10.

First of all, the p type InP cladding layer 1b, the undoped InGaAsP layer 2a, the n type InP layer 3a₁, an n type InGaAsP cap layer 13 about 0.1 μm thick, and an n type InP cap layer 14 about 0.1 μm thick are successively grown on the p type InP substrate 1 (FIG. 11(a)). The carrier concentrations of these cap layers 13 and 14 are about $1 \times 10^{18}$ cm$^{-3}$.

Figure 11D:
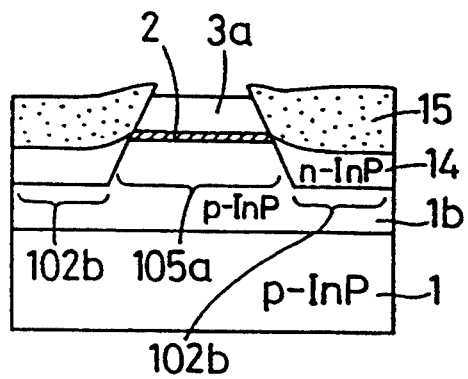
Figure 11B:
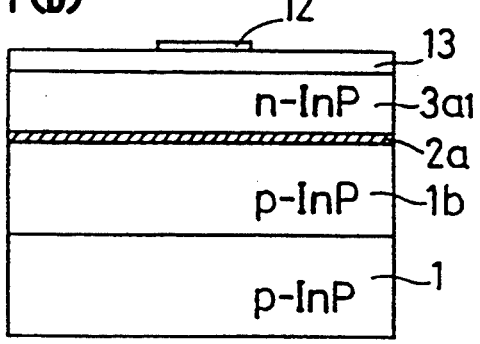

After removal of the n type InP cap layer 14 with hydrochloric acid, an SiO$_2$ film is deposited over the entire surface by sputtering and patterned using conventional photolithographic techniques, forming a stripe-shaped SiO$_2$ mask 12 along the (110) direction (FIG. 11(b)).

Figure 11E:
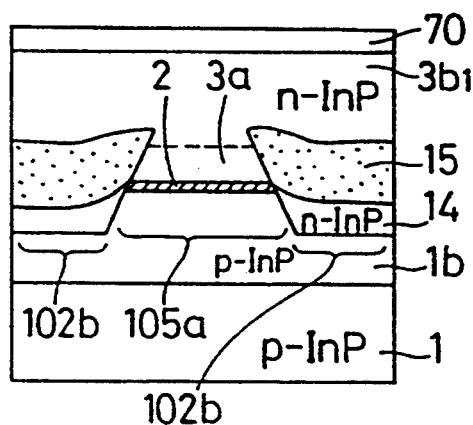
Figure 11C:
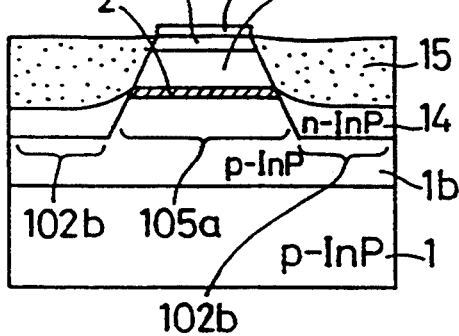
Figure 11F:
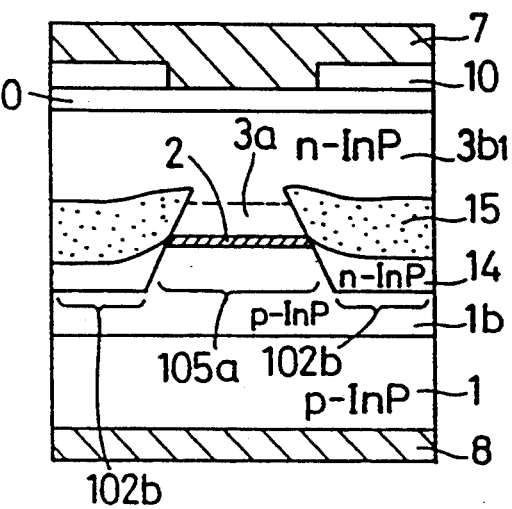

Thereafter, the mesa structure 105a is formed by HCl gas phase etching, and the light and current confinement structure 102b is formed by successively growing the n type InP current blocking layer 14 and the Fe-doped InP high resistivity layer 15 on the opposite sides of the mesa 105a (FIG. 11(c)).

After removal of the SiO$_2$ mask 12 with HF and the n type InGaAsP cap layer 13a with nitric acid (FIG. 11(d)), the n type InP cladding layer 3b₁ about 1 μm thick and the n type InP contact layer 70 about 0.1 μm thick are successively grown over the entire surface (FIG. 11(e)). Finally, the n side electrode 7 is formed on the contact layer 70 through the window of the insulating film 10, and the p side electrode 8 is formed on the rear surface of the p type InP substrate 1, completing the semiconductor laser 105 (FIG. 11(f)).

In the above-described production process, since the InGaAsP cap layer 13 that is damaged by the formation of the insulating mask 12 is removed after the formation of the mesa structure 105a, the top surface of the mesa structure 105a is not adversely affected by the formation of the insulating mask 12, so that the laser characteristics are not degraded.

While in the above-described second to fifth embodiment a p type InP substrate is employed, an n type InP may be employed. In this case, the same effects as described above are attained if the respective layers are of opposite conductivity types from those described above.

Figure 12:
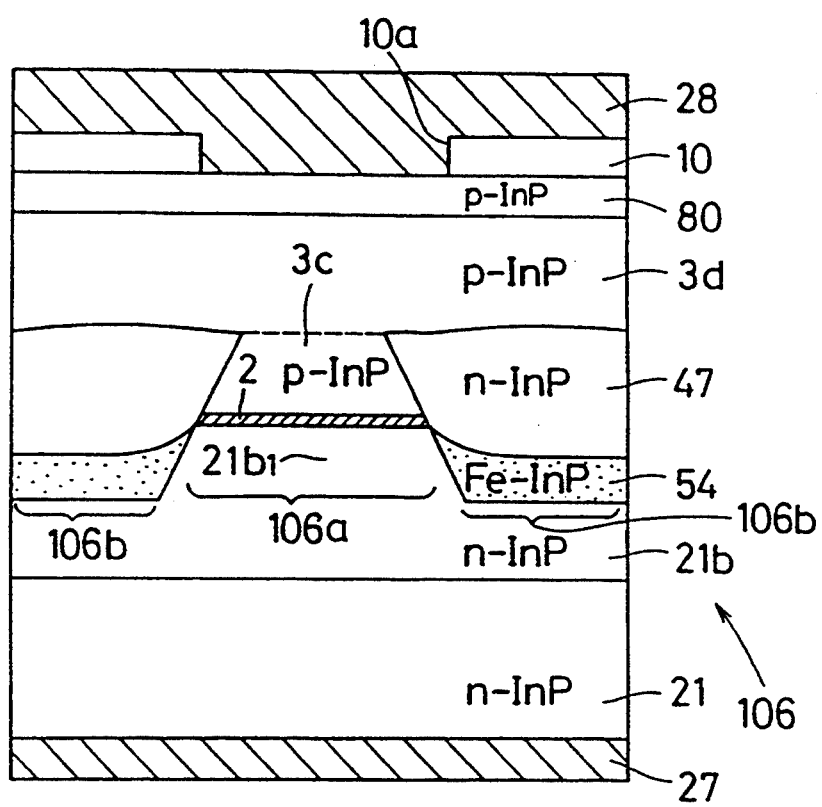
FIG. 12 is a sectional view illustrating a semiconductor laser in accordance with a sixth embodiment of the present invention.
Figure 14:
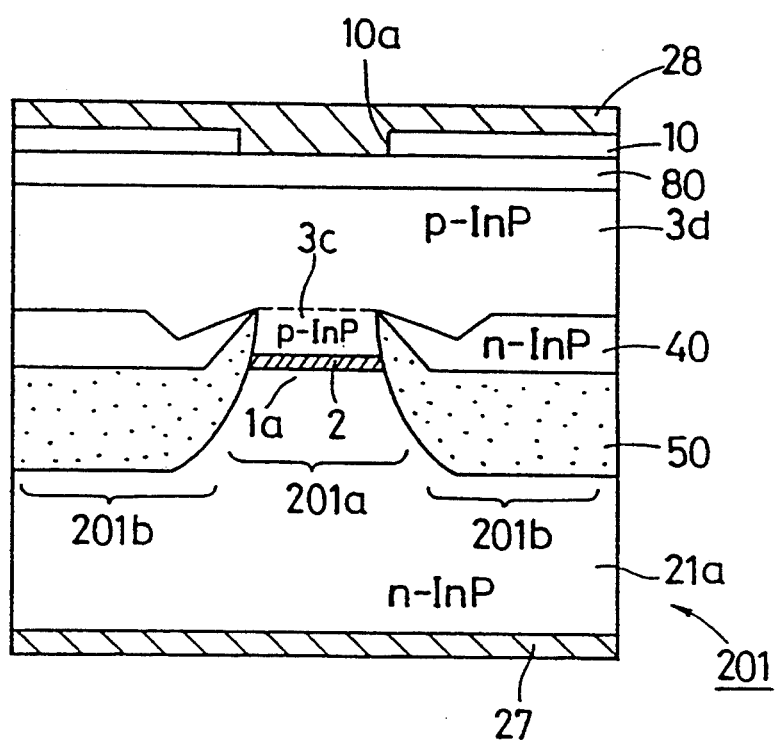
FIG. 14 is a sectional view illustrating a semiconductor laser including an Fe-doped InP current blocking layer on an n type InP substrate according to the prior art.
Figure 15A:
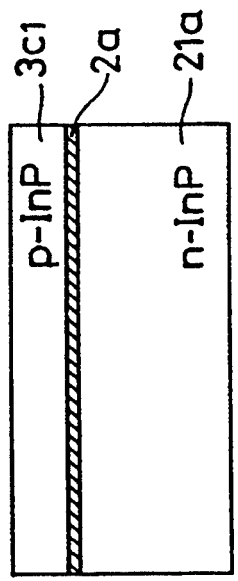
FIGS. 15(a)–15(e) are sectional views illustrating process steps in a method for producing the semiconductor laser of FIG. 14.
Figure 15B:
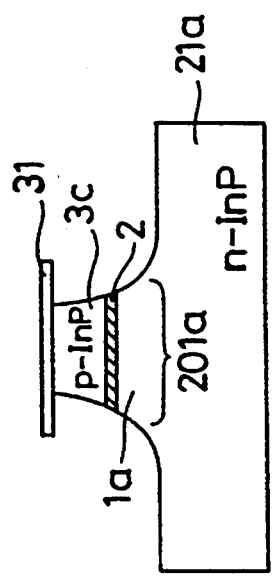
Figure 15C:
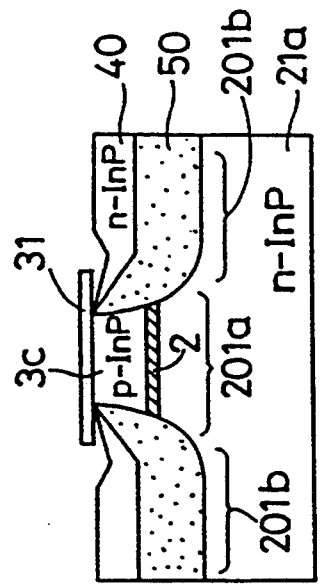
Figure 15D:
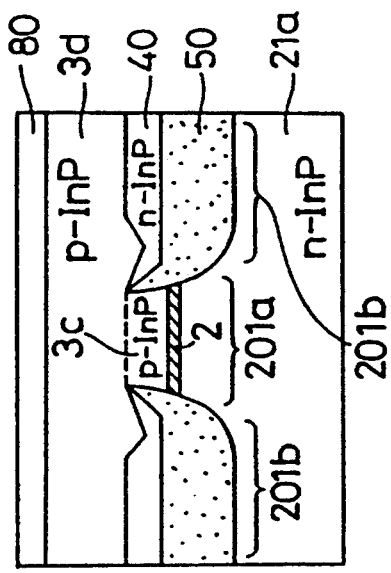
Figure 15E:
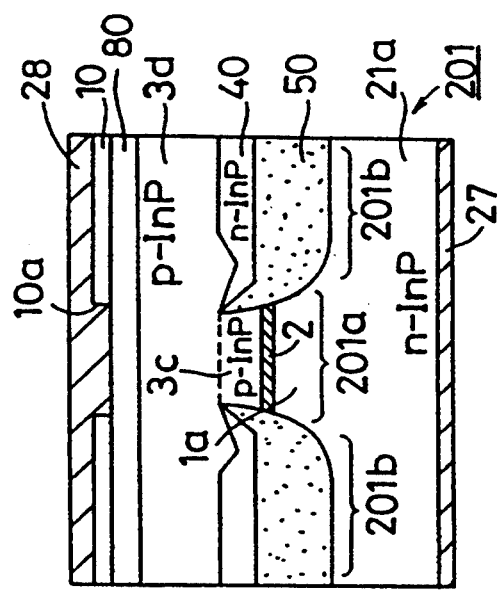
Figure 16:
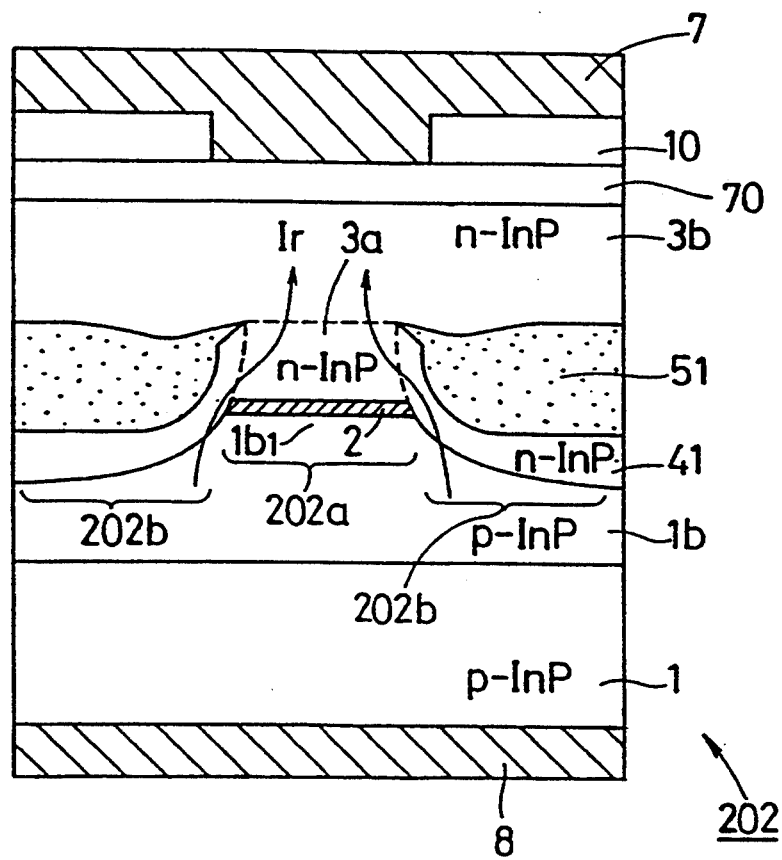
FIG. 16 is a sectional view illustrating a semiconductor laser including an Fe-doped InP current blocking layer on a p type InP substrate according to the prior art.
Figure 17:
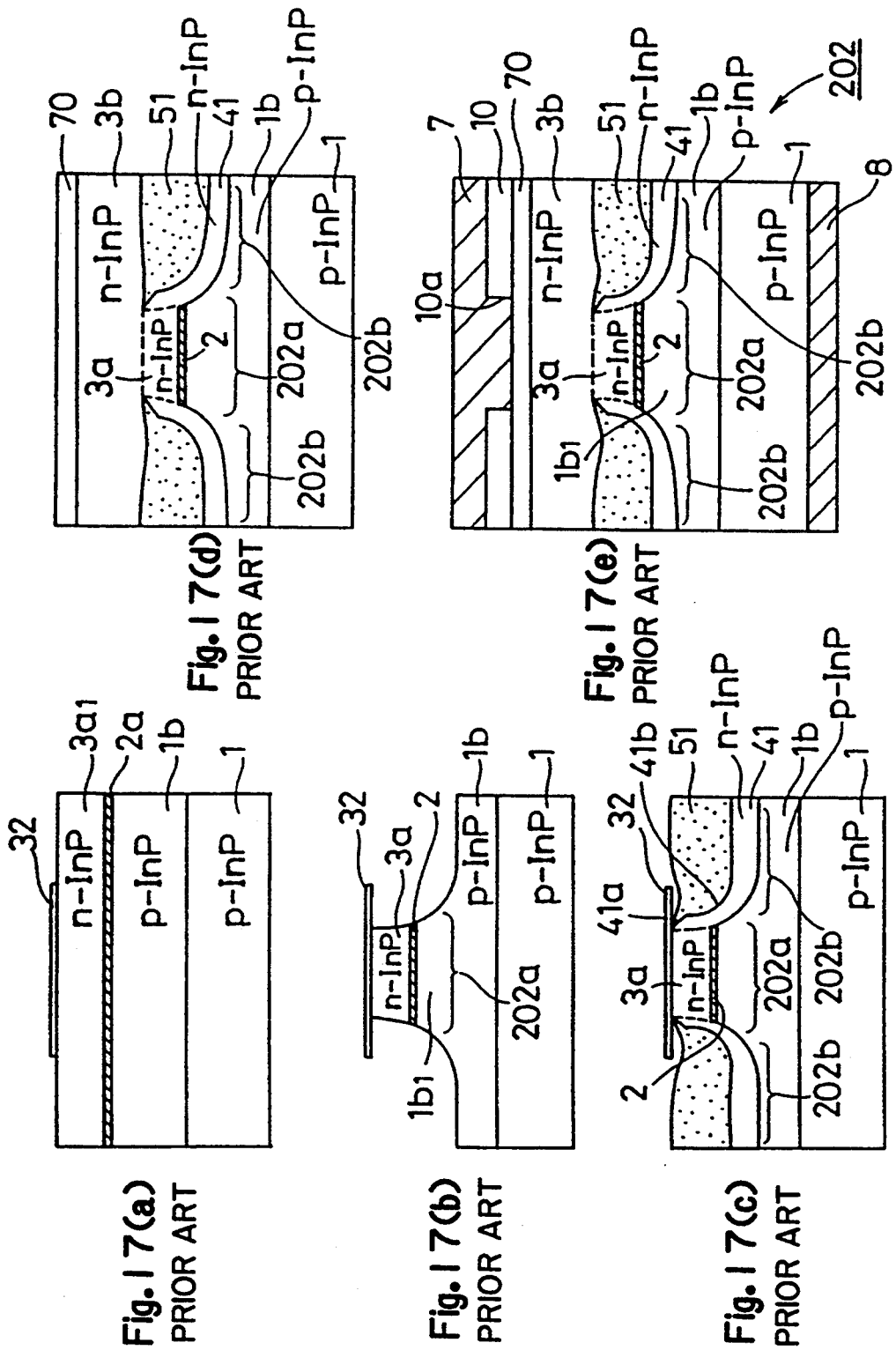
FIGS. 17(a)–17(e) are sectional views illustrating process steps in a method for producing the semiconductor laser of FIG. 16.
Figure 18:
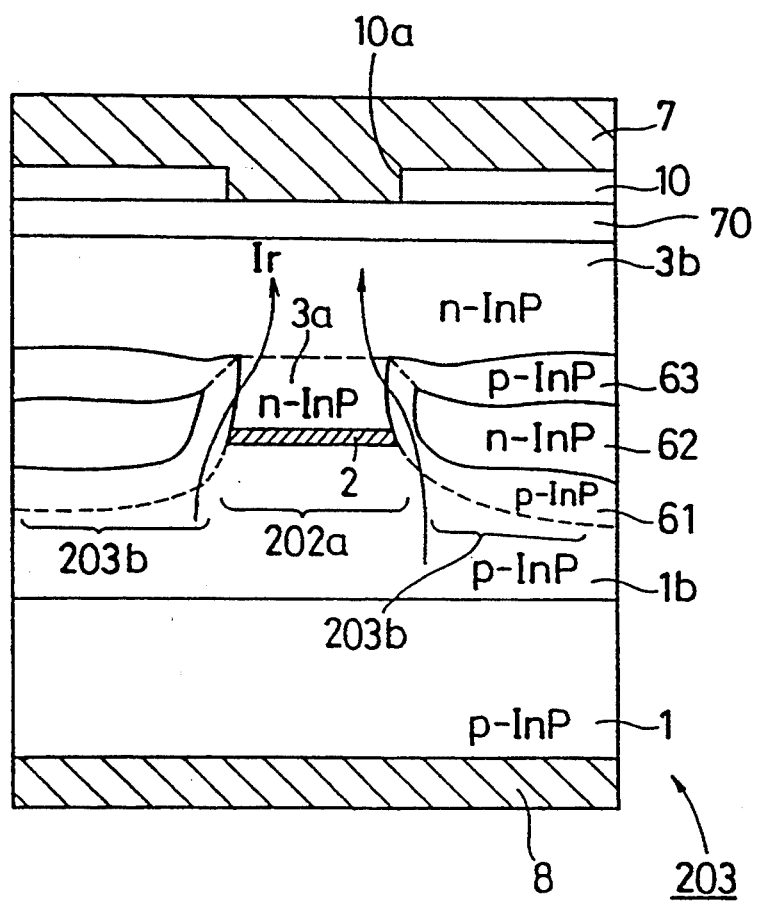
FIG. 18 is a sectional view illustrating a semiconductor laser including a pnp current blocking layer according to the prior art.
Figure 20A:
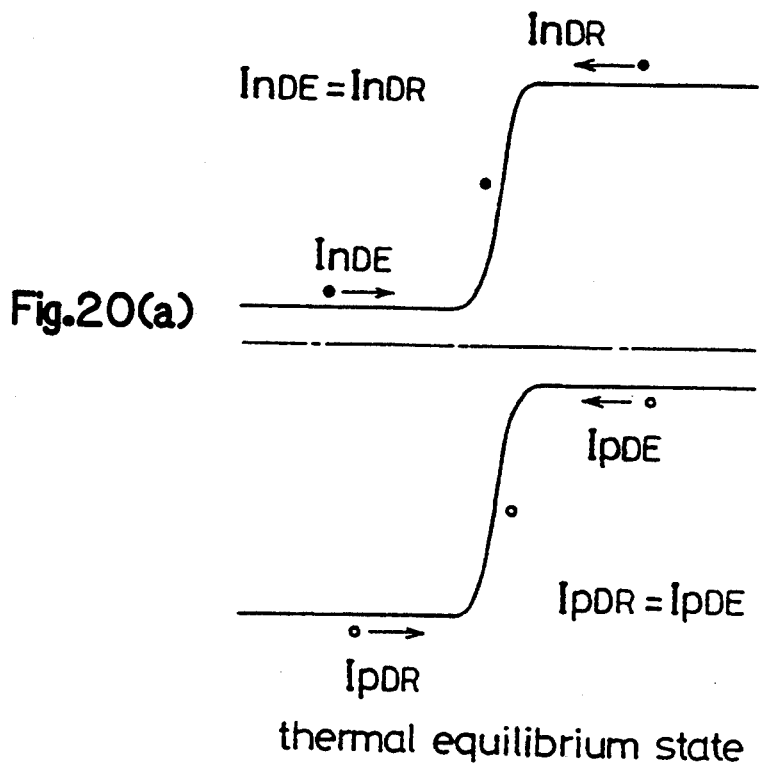
FIGS. 20(a) and 20(b) are energy band diagrams of a pn junction between a p type InP layer and an n type InP layer according to the prior art.
Figure 20B:
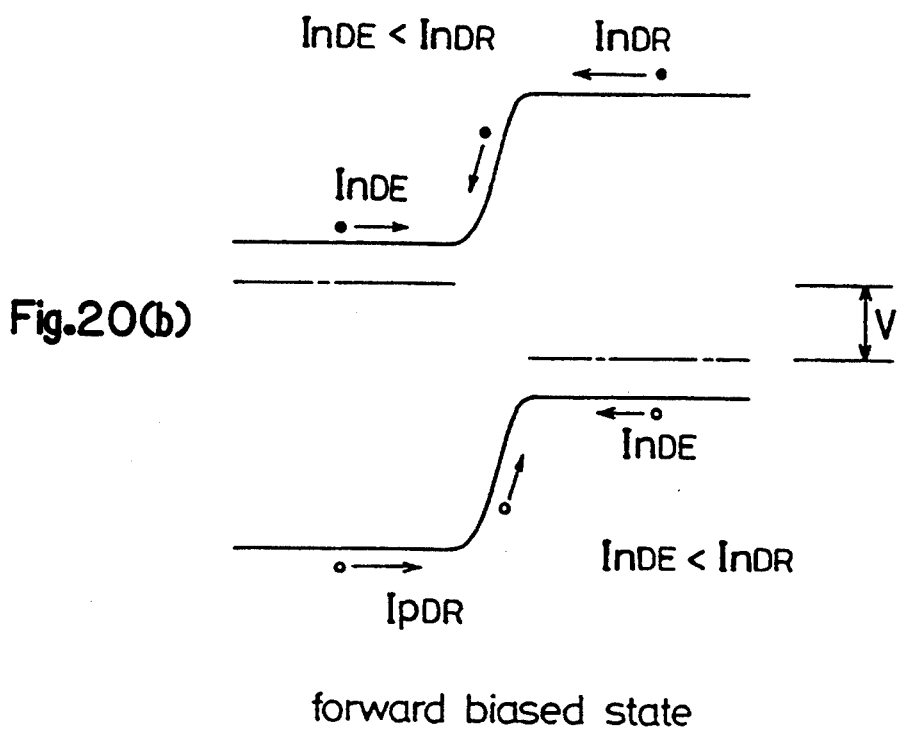
Figure 21A:
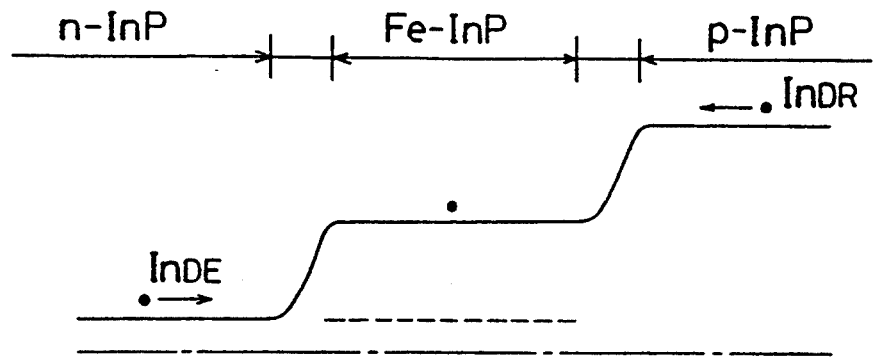
FIGS. 21(a) and 21(b) are energy band diagrams of a laminated semiconductor structure comprising p-InP, Fe-doped InP, and n-InP included in a semiconductor laser according to the prior art.
Figure 21B:
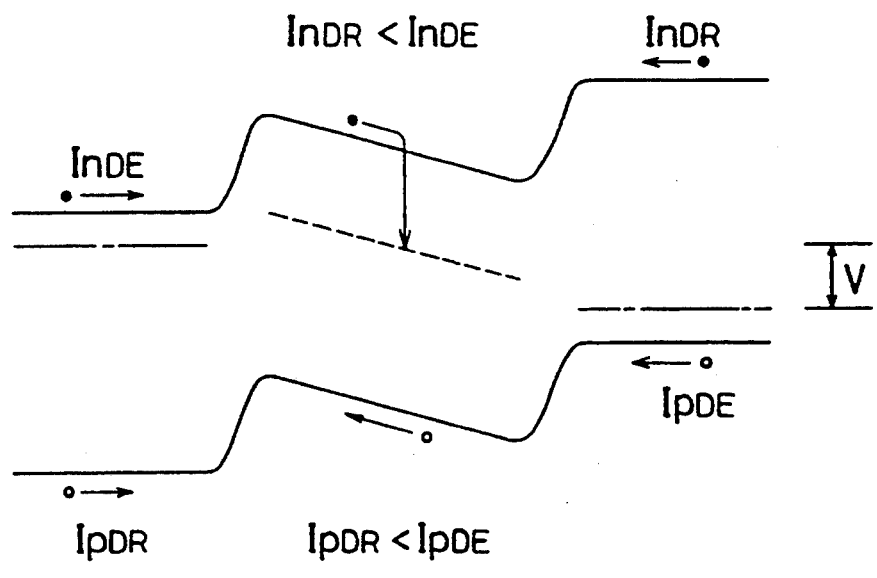

FIG. 12 is a sectional view illustrating a semiconductor laser in accordance with a sixth embodiment of the present invention. FIGS. 13(a)-13(e) are sectional views illustrating process steps in a method for fabricating the semiconductor laser of FIG. 12.

In FIG. 12, a semiconductor laser 106 of this sixth embodiment includes an n type InP substrate 21 having a surface in or near a (001) plane. A p type InP lower cladding layer 21b having a mesa portion 21b₁ is disposed on the n type InP substrate 21. An undoped InGaAsP active layer 2 is disposed on the mesa portion 21b₁. A p type InP upper cladding layer 3c is disposed on the active layer 2. A stripe-shaped mesa structure 106a comprises the mesa portion 21b₁ of the lower cladding layer 21b, the active layer 2, and the upper cladding layer 3c. The mesa structure 106a extends along the (110) direction and has opposite side surfaces in (111)B planes.

A light and current confinement structure 106b for confining laser light and laser driving current within the active layer 2 of the mesa 106a is disposed on the lower cladding layer 21b contacting the opposite sides of the mesa 106a. The light and current confinement structure 106b comprises an Fe-doped high resistivity semiconductor layer 54 which traps electrons (first charge carriers) and an n type InP current blocking layer 47 which blocks holes (second charge carriers) with a pn junction of the current blocking layer 47 and a p type InP cladding layer 3d disposed thereon. An edge of the high resistivity semiconductor layer 54 on the (111)B side surface of the mesa 106a is positioned at the boundary between the active layer 2 and the n type InP lower cladding layer 21b.

A description is given of the production process.

Initially, there are successively grown on the n type InP substrate 21 an n type InP cladding layer 21b about 2 μm thick having a carrier concentration of $1 \times 10^{18}$ cm$^{-3}$, an undoped InGaAsP layer 2a about 0.1 μm thick, and a p type InP layer 3c₁ about 0.5 μm thick having a carrier concentration of $1 \times 10^{18}$ cm$^{-3}$. These layers are grown by MOCVD. Thereafter, an SiO₂ film is deposited on the p type InP layer 3c₁ by sputtering and patterned by conventional photolithographic techniques, forming a stripe-shaped SiO₂ mask 12 along the (110) direction (FIG. 13(a)).

Then, the p type InP layer 3c₁, the InGaAsP layer 2a, and the n type InP cladding layer 21b are successively etched by HCl gas phase etching to a depth of about 2.5 μm from the surface of the p type InP layer 3c₁, forming the stripe-shaped mesa structure 106a (FIG. 13(b)). The angle between the side surface and the upper surface of the mesa 106a is about 55°, and a (111)B plane appears at the side surface of the mesa.

After the etching process, the n type InP substrate 21 having the mesa structure 106a is put in the MOCVD furnace without exposing the substrate to oxygen (air). In the MOCVD furnace, the Fe-doped InP high resistivity layer 54 about 1 μm thick having a carrier concentration of $4 \times 10^{16}$ cm$^{-3}$ is grown on the p type InP lower cladding layer 21b, contacting the opposite side surfaces of the mesa structure 106a, until the edge of the layer 54 on the side surface of the mesa reaches the boundary between the active layer 2 and the lower cladding layer 21b and, successively, the n type InP current blocking layer 47 about 1.5 μm thick with a carrier concentration of $7 \times 10^{18}$ cm$^{-3}$ is grown on the high resistivity layer 54, whereby the light and current confinement structure 106b is completed (FIG. 13(c)).

Since the flat surface of the n type InP cladding layer 21b at both sides of the mesa 106a is in a (100) plane and the side surface of the mesa 106a is in a (111)B plane, the InP layer does not directly grow on the side surface of the mesa 106a but directly grows on the flat surface of the n type InP cladding layer 21b in the MOCVD process. That is, the high resistivity InP layer 54 grows on the flat surface of the n type InP cladding layer 21b so that the edge of the layer 54 on the side surface of the mesa 106a gradually accumulates upward along the side surface of the mesa.

After removal of the SiO₂ mask 12 with HF, the second p type InP upper cladding layer 3d about 1 μm thick is grown on the first n type InP upper cladding layer 3c of the mesa structure 106a as well as on the n type InP current blocking layer 47 of the light and current confinement structure 106b and, successively, the p type InP contact layer 80 about 0.5 μm thick is grown on the cladding layer 3d in the MOCVD furnace (FIG. 13(d)).

To complete the semiconductor laser 106, a p side electrode 28 is formed on the p type InP contact layer 80 through the window of the insulating film 10, and an n side electrode 27 is formed on the rear surface of the n type InP substrate 21 (FIG. 13(e)).

In the semiconductor laser 106 according to the sixth embodiment of the present invention, since the edge of the Fe-doped high resistivity InP layer 54 on the side surface of the mesa structure 106a is positioned at the boundary between the lower cladding layer 21b and the active layer 2, the high resistivity InP layer 54 is not in contact with the active layer 2 at the side surface of the mesa 106a. Therefore, the unwanted diffusion of Fe into the active layer, which adversely affects the laser characteristics, is suppressed.

Furthermore, since the (111)B plane appears at the side surface of the mesa structure 106a formed by the HCl gas phase etching, the high resistivity semiconductor layer 54 does not directly grow on the side surface of the mesa 106a but grows from the bottom of the mesa, i.e., from the flat surface of the n type InP cladding layer 21b. Therefore, the structure in which the high resistivity InP mesa embedding layer 54 is not in contact with the active layer 2 of the mesa structure 106a is easily attained by switching the growth of the high resistivity semiconductor layer 54 to the growth of the n type InP current blocking layer 47 when the edge of the layer 54 on the side surface of the mesa reaches the boundary between the active layer 2 and the lower cladding layer 21b.

While in the above-described first to sixth embodiments the mesa structure having opposite side surfaces of (111)B planes is formed by the HCl gas phase etching, the mesa structure may be formed using a mixture of HCl, CH₃COOH, and H₂O₂ as an etchant.

What is claimed is:

1. A semiconductor laser comprising:
   a p-type semiconductor substrate having opposite front and rear surfaces;
   a double-heterojunction structure comprising a p-type lower cladding layer, and undoped active layer, and an n-type upper cladding layer successively disposed on the front surface of said semiconductor substrate, wherein the double-heterojunction structure includes a mesa having opposite sides; and a light and current confinement structure disposed on and contacting said p-type lower cladding layer and contacting the opposite sides of said mesa for confining laser light and laser driving current within said mesa and comprising a p-type mesa embedding layer, an n-type mesa embedding layer, and a semi-insulating InP layer successively disposed on said semiconductor substrate, said p-type mesa embedding layer contacting said mesa and said semi-insulating InP layer.

2. The semiconductor laser of claim 1 wherein said semiconductor substrate is InP and has a p side electrode on the rear surface, the p-type and n-type means embedding layers are InP, and the semi-insulating InP layer is doped with iron.

3. A semiconductor laser comprising:
p-type InP semiconductor substrate having a front surface in or near a (001) plane;
a double-heterojunction structure comprising a p-type lower cladding layer, an undoped active layer, and an n-type upper cladding layer successively disposed on the front surface of said substrate wherein the double-heterojunction structure is a stripe-shaped mesa having opposite side surface in (111)B planes and extending along a (110) direction; and
a light and current confinement structure disposed on and contacting said p-type lower cladding layer and contacting the opposite sides of said mesa for confining laser light and laser driving current within said mesa and comprising an n-type current blocking layer for blocking holes and a high resistivity InP layer disposed on and contacting said current blocking layer and containing a dopant impurity so that electrons are trapped in said high resistivity layer, wherein an upper edge on said n-type current blocking layer on each of the opposite (111)B side surface of said mesa contacts said n-type upper cladding layer at or near said active layer.

4. The semiconductor laser of claim 3 wherein said high resistivity InP layer is Fe-doped and said second conductivity type n-type current blocking layer is InP.

5. A semiconductor laser comprising:
an n-type InP semiconductor substrate having a front surface in or near a (001) plane;
a double-heterojunction structure comprising an n-type lower cladding layer, an undoped active layer, and a p-type upper cladding layer successively disposed on the front surface of said substrate wherein the double-heterojunction structure is a stripe-shaped mesa having opposite side surface in (111)B planes and extending along a (110) direction; and
a light and current confinement structure disposed on and contacting the opposite sides of said mesa for confining laser light and laser driving current within said mesa and comprising a p-type InP current blocking layer for blocking electrons and a Ti-doped InP high resistivity semiconductor layer disposed on said current blocking layer so that holes are trapped in said high resistivity layer, wherein an upper edge of said current blocking layer on each of the opposite (111)B side surfaces of said mesa contact said p-type upper cladding layer at or near said active layer.

6. A semiconductor laser comprising:
a semiconductor substrate of a first conductivity type having a front surface in or near a (001) plane;
a double-heterojunction structure comprising a first conductivity type lower cladding layer, an undoped active layer, and an upper cladding layer of a second conductivity type, opposite the first conductivity type, successively disposed on the front surface of said substrate wherein the double-heterojunction structure is a stripe-shaped mesa having opposite side surfaces in (111)B planes and extending along a (110) direction; and
a light and current confinement structure for confining laser light and laser driving current within said mesa and comprising a second conductivity type current blocking layer and a first conductivity type current blocking layer successively disposed on part of said lower cladding layer at opposite sides of said mesa and contacting the opposite (111)B side surfaces of said mesa, wherein said second conductivity type current blocking layer on each of the opposite (111)B side surfaces of said mesa contacts said mesa at least at said first conductivity type lower cladding layer but does not contact said second conductivity type upper cladding layer.

7. The semiconductor laser of claim 6 wherein said first conductivity type semiconductor substrate is a p type InP substrate, said first conductivity type current blocking layer is a p type InP layer, and said second conductivity type current blocking layer is an n type InP layer.

8. The semiconductor laser of claim 6 wherein said first conductivity type semiconductor substrate is an n type InP substrate, said first conductivity type current blocking layer is an n type InP layer, and said second conductivity type current blocking layer is a p type InP layer.

9. The semiconductor laser of claim 6 wherein said second conductivity type current blocking layer contacts said active layer.

10. A semiconductor laser comprising:
semiconductor substrate of a first conductivity type having a front surface in or near a (001) plane;
a double-heterojunction structure comprising a lower cladding layer of the first conductivity type, and undoped active layer, and an upper cladding layer of a second conductivity type, opposite the first conductivity type, successively disposed on the front surfaces of said surface substrate wherein the double-heterojunction structure is a stripe-shaped mesa having opposite side surfaces in (111)B planes and extending along a (110) direction;
a high resistivity semiconductor layer disposed on the first conductivity type lower cladding layer contacting the opposite side surfaces of said mesa and containing a dopant impurity so that first charge carries are trapped in said high resistivity layer, wherein an upper edge of said high resistivity layer on each of the opposite (111)B side surfaces of said mesa contacts said lower cladding layer at or near said active layer.
a first conductivity type current blocking layer for blocking second charge carriers disposed on said high resistivity semiconductor layer and contacting the opposite side surfaces of said mesa; and 11. The semiconductor laser of claim 10 wherein said first conductivity type semiconductor substrate is an n type InP substrate, said high resistivity semiconductor layer is an Fe-doped InP layer, and said first conductivity type current blocking layer is an n type InP layer.

12. The semiconductor laser of claim 10 wherein said first conductivity type semiconductor substrate is a p type InP substrate, said high resistivity semiconductor layer is a Ti-doped InP layer, and said first conductivity type current blocking layer is a p type InP layer.

* * * * *

UNITED STATES PATENT AND TRADEMARK OFFICE
CERTIFICATE OF CORRECTION

PATENT NO.    : 5,452,315          Page 1 of 2
DATED         : September 19, 1995
INVENTOR(S)   : Kimura et al.

It is certified that error appears in the above-indentified patent and that said Letters Patent is hereby corrected as shown below:

Column 20, Line 63, change "and" to --an--;

Column 21, Line 13, change "means" to --mesa--;

Line 16, before "p-type" insert --a--.

Line 23, change "surface" to --surfaces--;

Line 35, change "on" to --of--;

Line 37, change "surface" to --surfaces--;

Line 41-42, delete "second conductivity type";

Line 50, change "surface" to --surfaces--;

Column 22, Line 35, before "semiconductor" insert --a--;

Line 38, change "and" to --an--;

Line 42, delete "surface";

Line 50, change "carries" to --carriers--;

Line 54, change "." to --; and--.

Line 58, change ";and" to --.--.

UNITED STATES PATENT AND TRADEMARK OFFICE
CERTIFICATE OF CORRECTION

PATENT NO. : 5,452,315
DATED : September 19, 1995
INVENTOR(S) : Kimura et al.

It is certified that error appears in the above-indentified patent and that said Letters Patent is hereby corrected as shown below:

Line 58, change ";and" to --.--.

Signed and Sealed this

Eleventh Day of June, 1996

Attest:

BRUCE LEHMAN

*Attesting Officer*  *Commissioner of Patents and Trademarks*